(12) United States Patent
Lee et al.

(10) Patent No.: US 7,534,686 B2
(45) Date of Patent: May 19, 2009

(54) MULTI-STRUCTURED SI-FIN AND METHOD OF MANUFACTURE

(75) Inventors: Deok Hyung Lee, Kyunggi-Do (KR); Byeong Chan Lee, Kyunggi-do (KR); In Soo Jung, Kyunggi-do (KR); Yong Hoon Son, Kyunggi-do (KR); Siyoung Choi, Kyunggi-do (KR); Taek Jung Kim, Kyunggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 371 days.

(21) Appl. No.: 11/589,718

(22) Filed: Oct. 31, 2006

(65) Prior Publication Data

US 2007/0048947 A1 Mar. 1, 2007

Related U.S. Application Data

(62) Division of application No. 10/778,147, filed on Feb. 17, 2004, now Pat. No. 7,141,856.

(30) Foreign Application Priority Data

Aug. 14, 2003 (KR) ................ 2003-56636

(51) Int. Cl.
*H01L 21/336* (2006.01)
(52) U.S. Cl. .............. 438/283; 438/197; 438/212; 438/734; 438/735
(58) Field of Classification Search ............. None
See application file for complete search history.

(56) References Cited

U.S. PATENT DOCUMENTS

| | | | |
|---|---|---|---|
| 6,413,802 B1 | 7/2002 | Hu et al. | |
| 6,475,890 B1 | 11/2002 | Yu | |
| 6,656,796 B2 | 12/2003 | Chan et al. | |
| 6,767,813 B2 | 7/2004 | Lee et al. | |
| 6,838,322 B2 | 1/2005 | Pham et al. | |
| 7,056,781 B2 * | 6/2006 | Yoon et al. | 438/197 |
| 2001/0030327 A1 | 10/2001 | Furushima | |
| 2002/0011612 A1 | 1/2002 | Hieda | |
| 2004/0026736 A1 | 2/2004 | Grupp et al. | |
| 2004/0063286 A1 | 4/2004 | Kim et al. | |
| 2004/0110331 A1 | 6/2004 | Yeo et al. | |
| 2004/0145000 A1 | 7/2004 | An et al. | |
| 2004/0159911 A1 | 8/2004 | Essilfie | |
| 2004/0217433 A1 | 11/2004 | Yeo et al. | |
| 2004/0219722 A1 | 11/2004 | Pham et al. | |
| 2004/0256647 A1 | 12/2004 | Lee et al. | |

(Continued)

*Primary Examiner*—N Drew Richards
*Assistant Examiner*—Khanh B Duong
(74) *Attorney, Agent, or Firm*—Harness, Dickey & Pierce, P.L.C.

(57) ABSTRACT

Disclosed is a semiconductor fin construction useful in Fin-FET devices that incorporates an upper region and a lower region with wherein the upper region is formed with substantially vertical sidewalls and the lower region is formed with inclined sidewalls to produce a wider base portion. The disclosed semiconductor fin construction will also typically include a horizontal step region at the interface between the upper region and the lower region. Also disclosed are a series of methods of manufacturing semiconductor devices incorporating semiconductor fins having this dual construction and incorporating various combinations of insulating materials such as silicon dioxide and/or silicon nitride for forming shallow trench isolation (STI) structures between adjacent semiconductor fins.

15 Claims, 17 Drawing Sheets

U.S. PATENT DOCUMENTS

2004/0262688 A1  12/2004  Nowak et al.
2005/0023619 A1   2/2005  Orlowski et al.
2005/0057964 A1   3/2005  Matthew et al.

* cited by examiner

US 7,534,686 B2

MULTI-STRUCTURED SI-FIN AND METHOD OF MANUFACTURE

CROSS-REFERENCE TO RELATED CASES

This application is a divisional of application Ser. No. 10/778,147, which was filed on Feb. 17, 2004, now U.S. Pat. No. 7,141,856 and from which priority is claimed under 35 U.S.C. § 120. This application also claims priority under 35 U.S.C. § 119 from Korean Patent Application No. 2003-56636, which was filed on Aug. 14, 2003, in the Korean Intellectual Property Office. The entire contents of both of these applications are incorporated herein by reference.

BACKGROUND OF THE INVENTION

1. Field of the Invention

The invention relates to an improved Si-fin structure, semiconductor devices incorporating such Si-fin structures, methods of manufacturing such improved Si-fin structures and semiconductor manufacturing processes that incorporate such manufacturing methods.

2. Description of the Prior Art

Over the past 30 years, silicon-based integrated circuits and, in particular, metal-oxide-semiconductor (MOS) devices such as field effect transistors (FET or MOSFET) have consistently delivered greater speed, increased integration density and improved functionality while simultaneously reducing the cost per operation of the improved semiconductor devices. MOS devices are typically formed in a substrate 10 having heavily doped source/drain (S/D) regions 12 separated by a more lightly-doped channel region 18. The channel region 18 is, in turn, controlled by a gate electrode 14 that is separated from the channel region by a gate dielectric 16.

As the demand for speed and functional improvements continues unabated, a wide variety of structures, processes and equipment have been developed in order to provide the desired improvements. Conventional bulk-MOS techniques and designs as illustrated in FIG. 1A, are, however, approaching the practical limits of the technology and are giving rise to more complex techniques in order to control the short-channel effects and obtain useable channel lengths of 100 nm and below. These more complex techniques, however, tend to both increase the cost and decrease the yield of the resulting devices, making them less practical for general semiconductor manufacturing.

A variety of transistor designs have been proposed for overcoming certain of the deficiencies of the conventional bulk-MOS semiconductor devices including, for example, the ultra-thin body transistor, FIG. 1B, in which the channel region 18 is formed in a thin layer formed above an insulating region, and the double-gate transistor, FIG. 1C, in which a single channel region 18 is controlled by two gates 14a, 14b that are separated from the channel region by separate gate dielectrics 16a, 16b.

FinFETs, in which the channel is formed in, the gate dielectrics are formed on, and the gate electrode is formed around a semiconductor "fin" provide structures in which the channels may be formed first, followed by the source and drain regions, a process that will tend to produce source/drain regions that are taller than the channel fin. Dielectric and conductive materials may then be sued to form what is essentially a double- or triple-gate device.

Conventional bulk-MOS devices utilize heavy channel doping to control short channel effects. These processes, however, become increasingly difficult to control as the channel length design drops below about 100 nm. Indeed, conventional bulk-MOS devices and technology, when pushed to achieve smaller critical dimensions, tend to exhibit undesirable channel mobility, subthreshold voltage instability, junction leakage, junction capacitance and current depletion.

Similarly, the ultra-thin body transistors are considerable more expensive that the conventional bulk-MOS devices to produce and, although providing improved performance in some areas, tend to exhibit characteristic electrical variations such as floating body and heat transfer effects and have current limitations imposed by the body thickness. Double-gate devices, by controlling the junction from two sides, tend to exhibit improved leakage performance, but generally necessitate the use of a complicated manufacturing process that both increases the expense and lowers the yield. The particular structures noted are not intended to be exhaustive and it is expected, therefore, that those of ordinary skill in the art will be aware of other particular constructions and/or processes that have been implemented or evaluated by various individuals or groups during efforts to address the deficiencies of the known processes and structures for manufacturing devices having channel lengths below about 100 nm.

FinFET transistors, i.e., those in which the channel is formed in a raised "fin" of semiconductor material, however, are able to provide leakage performance similar to or better than that provided by double-gate transistors, but tend to be both less complicated and less expensive to produce. FinFET transistors (or simply FinFETs) are also expected to support the scaling of channel length to below 50 nm and perhaps to about 10 nm, thereby allowing additional improvements in integration density and functional speed.

As taught in U.S. Pat. No. 6,413,802, which is incorporated herein by reference, in its entirety, FinFET devices may be manufactured from a silicon layer provided on an insulating layer, such as a buried silicon oxide (BOX) layer, that has been formed on a silicon substrate to form a silicon-on-insulator (SOI) structure. FinFETs formed in this manner, however, may remain expensive to produce, limit the degree of integration that may be achieved and suffer from variable electrical performance and/or reduced yield.

As taught in U.S. Patent Application No. 2002-0011612, which is incorporated herein by reference, in its entirety, FinFET devices may also be manufactured on a bulk semiconductor substrate. FinFETs formed in this manner, however, may result in mechanical strain and/or defects at the boundary between the fin material and the isolation oxide that will tend to increase the leakage and degrade device performance and increase the difficulty of obtaining uniform filling of the spaces between adjacent fin structures.

BRIEF SUMMARY OF THE INVENTION

Exemplary embodiments of the invention incorporate semiconductor devices having a semiconductor fin structure that includes an upper portion, the upper portion having a first thickness $t_1$ and a substantially constant width $w_0$, a lower portion, the lower portion having a second thickness $t_2$, a top width $w_1$ adjacent the upper portion and a bottom width $w_2$, wherein $w_1 < w_2$. The semiconductor fin structure according to the exemplary embodiments of the invention will also tend to be constructed in a manner that the width of the upper portion of the silicon fin and the top width of the lower portion of the semiconductor fin will satisfy the relationship $w_0 < w_1$ and the first thickness and the second thickness will satisfy the relationship $t_1 < t_2$.

According to the exemplary embodiments, the upper portion of the semiconductor fin structure will have substantially vertical sidewalls while the lower portion will include inclined sidewalls with the inclination being between about 3 degrees and about 10 degrees, from vertical. Exemplary embodiments of the semiconductor fin may also include step regions at the boundary between the upper and lower portions of the fin, with the step regions having a substantially horizontal surface and a width of about $(w_1-w_0)/2$.

Also disclosed are exemplary methods for manufacturing semiconductor devices incorporating such semiconductor fin structures. Exemplary methods may include forming an etch mask pattern on a silicon substrate, removing a first thickness of the silicon substrate not protected by the etch mask pattern to form an upper silicon pattern, wherein a first set of etch conditions are selected to produce substantially vertical sidewalls on the upper silicon pattern, and removing a second thickness of the silicon substrate not protected by the etch mask pattern to form a lower silicon pattern, wherein a second set of etch conditions are selected to produce inclined sidewalls on the lower silicon pattern, the upper silicon pattern and the lower silicon pattern cooperating to form a final silicon pattern.

Variations of these exemplary methods may include modified substrates that incorporate an epitaxial layer designed to produce devices having a certain range of performance and/or to simplify achieving such performance by providing a thin layer having properties different than those of the bulk substrate. Such substrates may include one or more epitaxial silicon layers formed on bulk single crystal silicon substrate.

When such substrates are utilized, the exemplary methods may be adapted to produce semiconductor fin structures in which the upper silicon pattern is formed in the epitaxial silicon layer and the lower silicon pattern extends into the bulk single crystal silicon. By selecting various combinations of substrate materials, photolithographic processes and etch processes, exemplary semiconductor fin structures may be prepared in which the a ratio of the first thickness to the second thickness is between about 1:3 to about 3:1.

Another exemplary method of manufacturing a semiconductor device including such a semiconductor fin structure includes forming an etch mask pattern on a silicon substrate, removing a first thickness $t_1$ of the silicon substrate not protected by the etch mask pattern to form an upper silicon pattern. The etch conditions used for this etch may be selected to produce substantially vertical sidewalls on the intermediate silicon pattern. Once the upper or intermediate silicon pattern is formed, spacer structures may be formed adjacent the sidewalls of the intermediate silicon pattern, removing a second thickness $t_2$ of the silicon substrate not protected by the etch mask pattern and the spacer structures to form a lower silicon pattern. The etch conditions used for this second etch may be selected to produce inclined sidewalls on the lower silicon pattern. The upper silicon pattern and the lower silicon pattern cooperate to form a final silicon pattern. Once the final silicon pattern has been prepared, subsequent processing may include depositing an insulating material on the final silicon pattern, the insulating material having a thickness at least equal to $t_2$, removing an upper portion of the insulating material to expose portions of the sidewalls of the upper silicon pattern, forming a gate dielectric layer on the exposed portions of the sidewalls of the upper silicon pattern, and forming a gate electrode on the gate dielectric layer.

Forming the etch mask pattern may include forming an oxide layer on the silicon substrate, forming a nitride layer on the oxide layer, forming a photoresist pattern on the nitride layer, removing the portions of the nitride layer and the oxide layer that are not protected by the photoresist pattern, and removing the photoresist pattern. Forming the spacer structures on the sidewalls of the intermediate silicon pattern may include forming an oxide layer on the intermediate silicon pattern, forming a nitride layer on the oxide layer, removing a portion of the nitride layer and a portion of the oxide layer to form spacer structures on the sidewalls of the intermediate silicon pattern.

Forming the layer of insulating material on the final silicon pattern, the insulating material having a thickness at least equal to $t_2$, may include depositing an insulating material layer to a thickness greater than $t_1+t_2$ and removing an upper portion of the insulating material layer to expose an upper surface of the intermediate silicon pattern and an upper surface of the spacer structures. A variety of conventional techniques may be used to remove the upper portions of the insulating material including etch back and chemical-mechanical planarization (CMP) to remove the "high" points of material from a wafer to improve the planarity and uniformity for subsequent processing. Exposing at least a portion of the sidewalls of the upper silicon pattern may include removing at least an upper portion of the nitride included in the spacer structures and removing at least an upper portion of the oxide included in the spacer structures.

Implanting a dopant species into a region of the exposed portion of the intermediate silicon pattern to modify transistor channel characteristics may occur after exposing at least a portion of the sidewalls of the upper silicon pattern and before forming a gate dielectric layer on the exposed portions of the sidewalls of the upper silicon pattern. During the dopant implant process, the implant beam used to deliver the dopant species to a region of the exposed portion of the intermediate silicon pattern may depart from a vertical orientation with respect to the surface of the semiconductor device by an offset angle of between about 5 degrees and about 30 degrees.

BRIEF DESCRIPTION OF THE DRAWINGS

These and other objects, features and advantages of the present invention will be readily understood with reference to the following detailed description thereof provided in conjunction with the accompanying drawings, wherein the same reference numerals designate corresponding structural elements, and, in which.

These drawings are provided for illustrative purposes only and are not drawn to scale. The spatial relationships and relative sizing of the elements illustrated in the various embodiments may have been reduced or expanded to improve the clarity of the figure with respect to the corresponding description. The figures, therefore, should not be interpreted as reflecting the relative sizing or positioning of the corresponding structural elements that could be encompassed by an actual device manufactured according to the exemplary embodiments of the invention.

DETAILED DESCRIPTION OF EXEMPLARY EMBODIMENTS

Figure 1A:
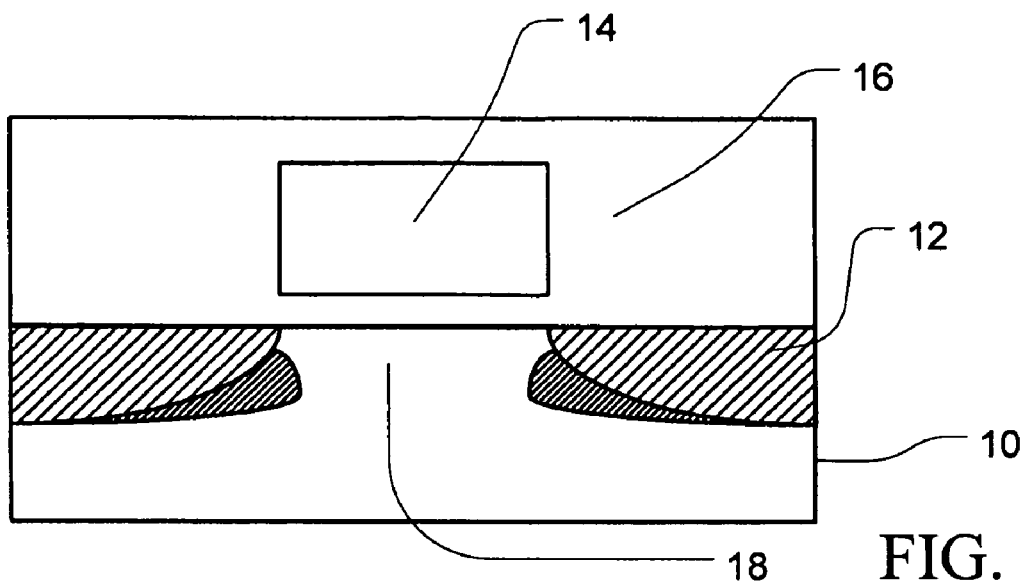
FIGS. 1A-C generally illustrate certain prior art transistor configurations.
Figure 1B:
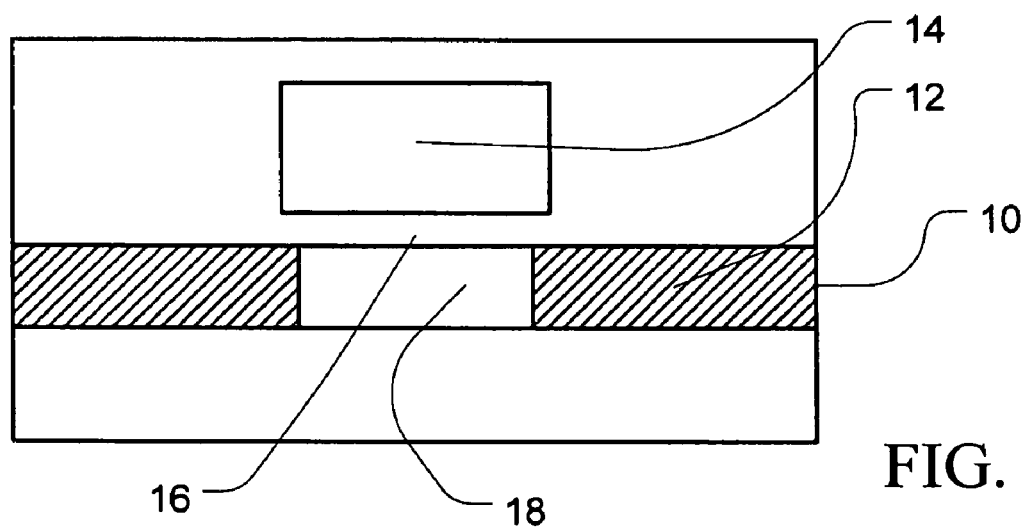
Figure 1C:
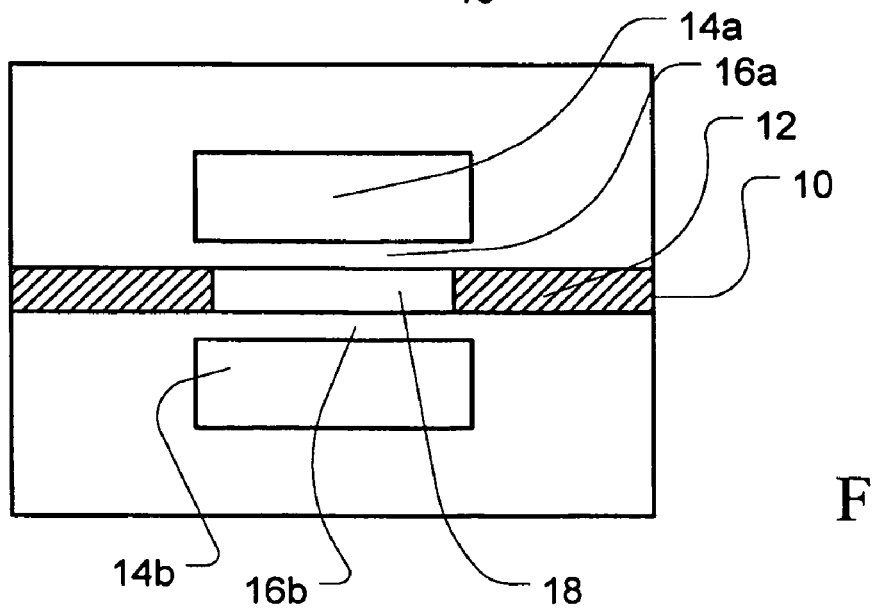
Figure 2A:
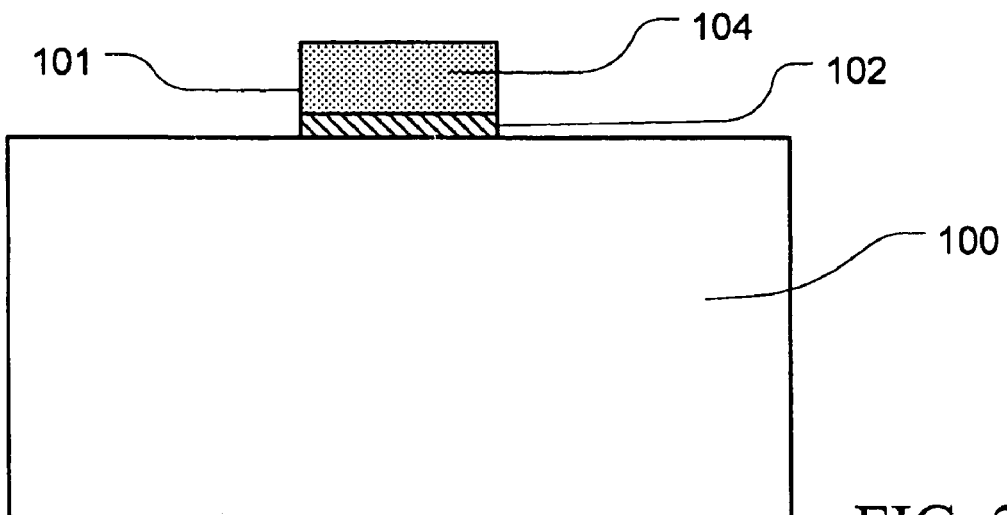
FIGS. 2A-H illustrate the manufacture of a FinFET according to a first exemplary embodiment of the invention.

As illustrated in FIG. 2A, an exemplary method for manufacturing FinFET devices incorporating the exemplary fin configuration starts with a semiconductor substrate 100, such as silicon. The substrate utilized may be selected from a range of substrate configurations including, for example, wafers cut from Czochralski (CZ) or Float Zone (FZ) prepared single crystal bulk silicon substrates and modified substrates including, for example, substrates incorporating one or more features such as epitaxial layers, buried insulating layers or doped regions selected to provide the desired structural and performance characteristics in the completed device. An etch mask pattern 101, typically including a buffer layer 102, such as 50-200 Å of silicon dioxide, formed directly on the substrate 100 and an upper layer 104, such as 500-1000 Å of silicon nitride, formed on the buffer layer may then be formed by patterning and etching the layer(s) using conventional photolithographic and dry and/or wet etches.

Figure 2B:
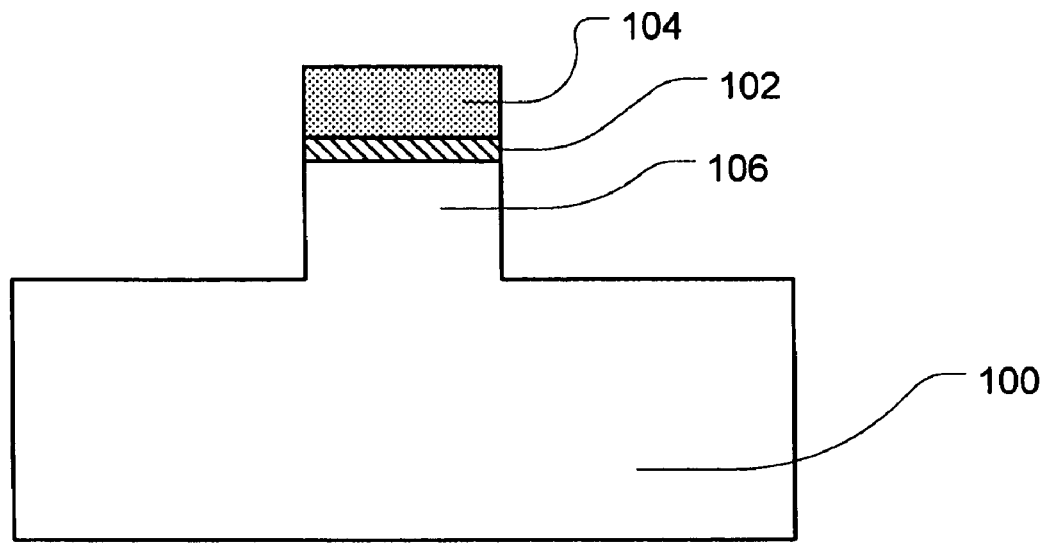
Figure 2C:
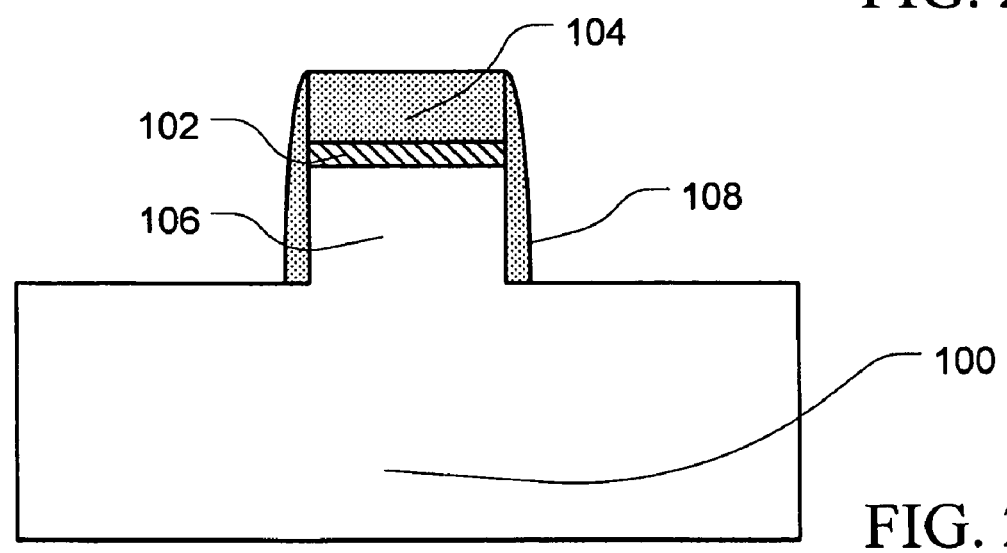

As illustrated in FIG. 2B, once the etch pattern has been formed, a portion, for example 500-1500 Å, of the unprotected substrate 100 is removed to form a first pattern 106. The combination of etch gases and etch conditions used to form the first pattern 106 are preferably selected to produce substantially vertical sidewalls on the first pattern. As illustrated in FIG. 2C, sidewall spacers 108 may then be formed on the first pattern 106, typically by forming a buffer layer of a first material, such as 50-300 Å silicon oxide (not illustrated) and a second layer of a different material, such as 100-300 Å of silicon nitride (not illustrated) on the first pattern and then performing an etchback process to remove the all but those portions of the spacer material(s) adjacent the sidewalls of the first pattern.

Figure 2D:
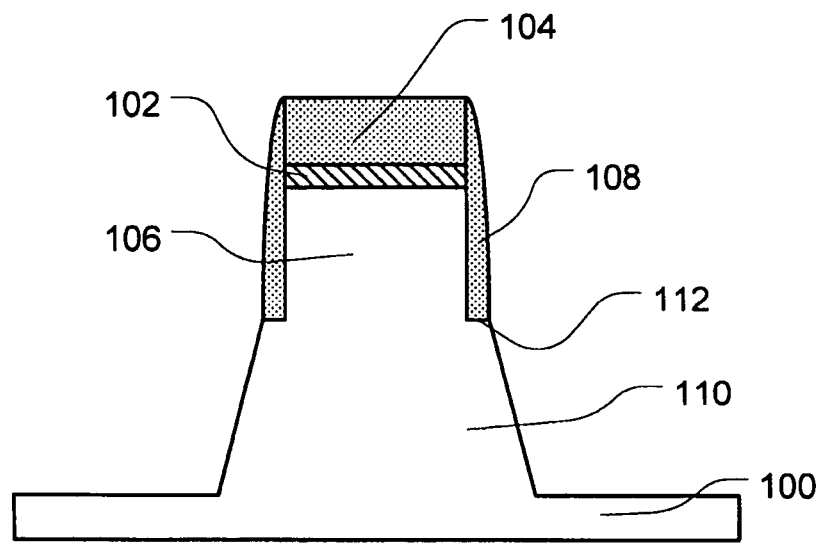

As illustrated in FIG. 2D, after forming the sidewall spacers 108, another portion, for example 1000-4500 Å, of the unprotected substrate 100 is removed to form a second pattern 110. The combination of etch gases and etch conditions used to form the second pattern are preferably selected to produce a non-vertical, bell-shaped or inclined sidewall configuration that may form an angle with a plane defined by the substrate of between about 80 and 89 degrees, more typically between about 84 and 88 degrees.

Both the first and second etches may be achieved using a combination of $O_2$, HBr and $Cl_2$ in a dry etch process using conventional dry etch equipment. Conventional dry or plasma etch equipment allows operators to set a variety of process conditions including bias power, chamber pressure, gas flow rates and $HBr/Cl_2$ ratios. The specific parameters will depend on the equipment design, the composition of the materials being etched, the relative thicknesses of the various materials, the selectivity of the etch process, loading effects and other variables well known to those skilled in plasma etching. In general, however, etch processes intended to achieve a substantially vertical profile in a silicon substrate will, relative to etch processes intended to achieve a tapered or inclined profile, tend to utilize a lower bias power, a higher chamber pressure, a reduced $HBr/Cl_2$ ratio and an increased $O_2$ flow rate.

The resulting semiconductor fin structure 113 will include both a first pattern 106 portion having substantially vertical sidewalls and a second pattern 110 portion having inclined sidewalls, with the demarcation between the two patterns being indicated by a generally horizontal step portion 112, the width of which will largely be determined by the thickness of the sidewall spacer 108. The mask pattern 101 and the sidewall structures 108 then be removed to obtain a clean fin structure suitable before additional processing or, as described in more detail below, some or all of the mask pattern and sidewall structures may remain in place during subsequent processing.

Figure 2E:
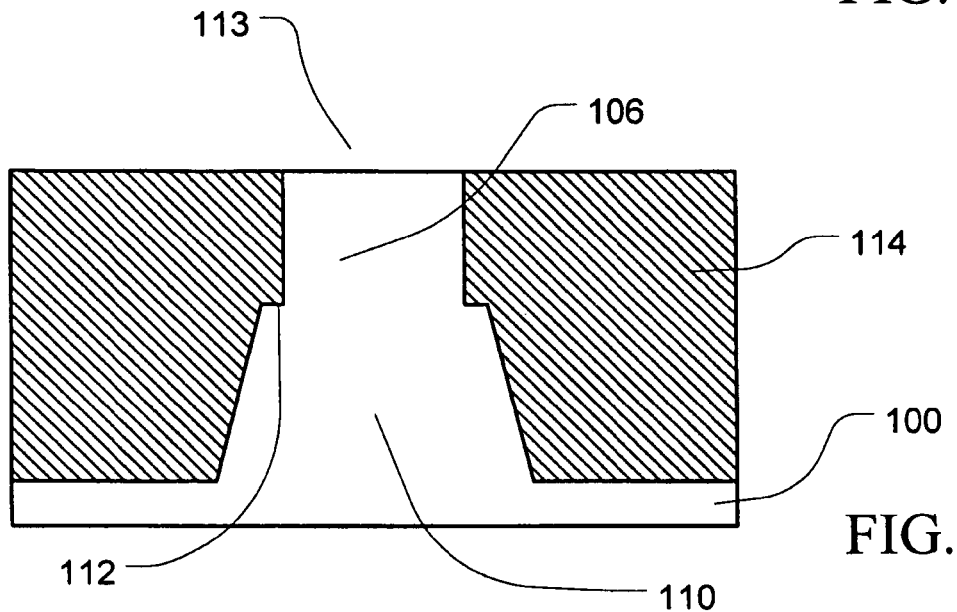
Figure 2F:
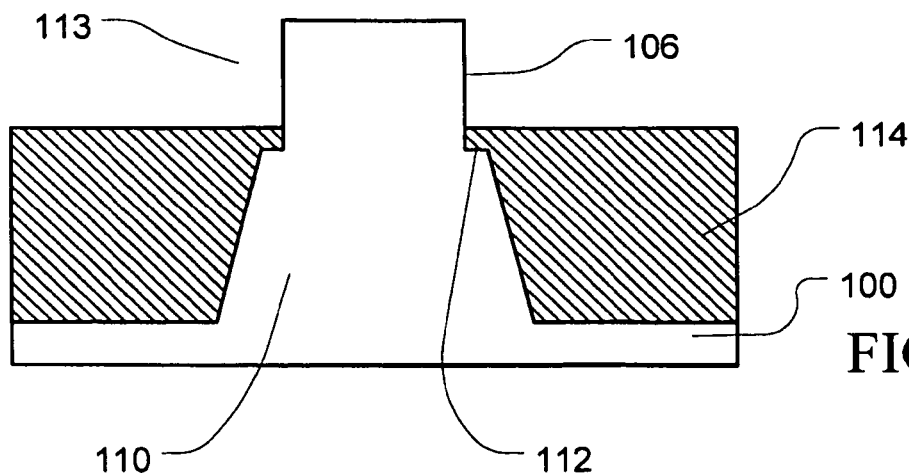

As illustrated in FIG. 2E, the mask pattern 101 and the sidewall structures 108 have been removed and an insulating layer 114, such as silicon dioxide, can be formed on the substrate 100 to fill the spaces between adjacent fin structures. Although illustrated as a generally homogeneous film, those of ordinary skill in the art will appreciate that the insulating layer 114 may incorporate one than one layer and more than one insulating material. Particularly when conformal films are utilized to form insulating layer 114, an upper portion of the insulating layer may be removed to expose an upper surface of the fin structure 113 and/or provide a planarized surface for subsequent processing. As illustrated in FIG. 2F, for example, an upper portion of the insulating layer 114 may be removed to expose a portion of the first pattern 106 of the semiconductor fin structure 113.

Figure 2G:
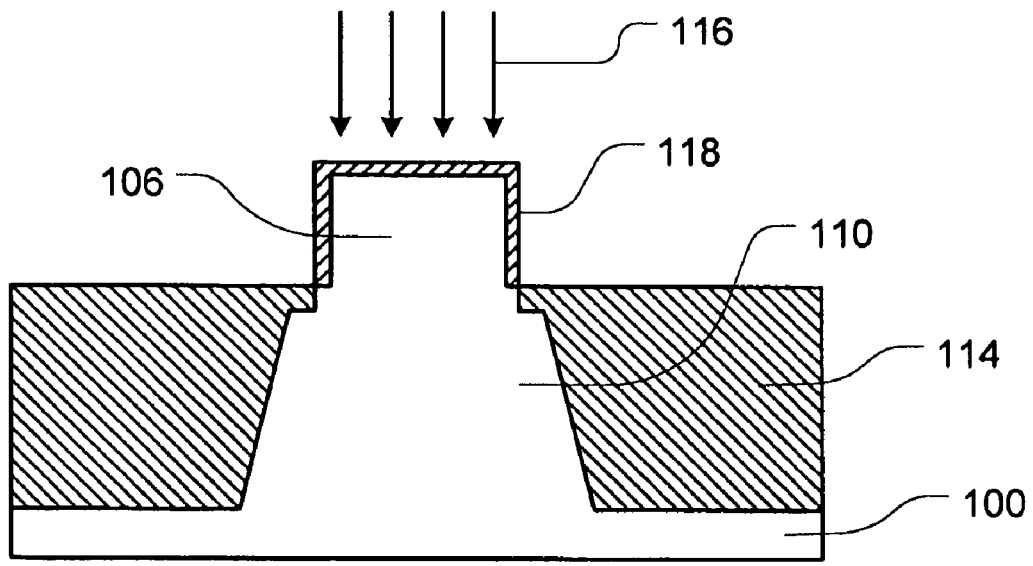
Figure 2H:
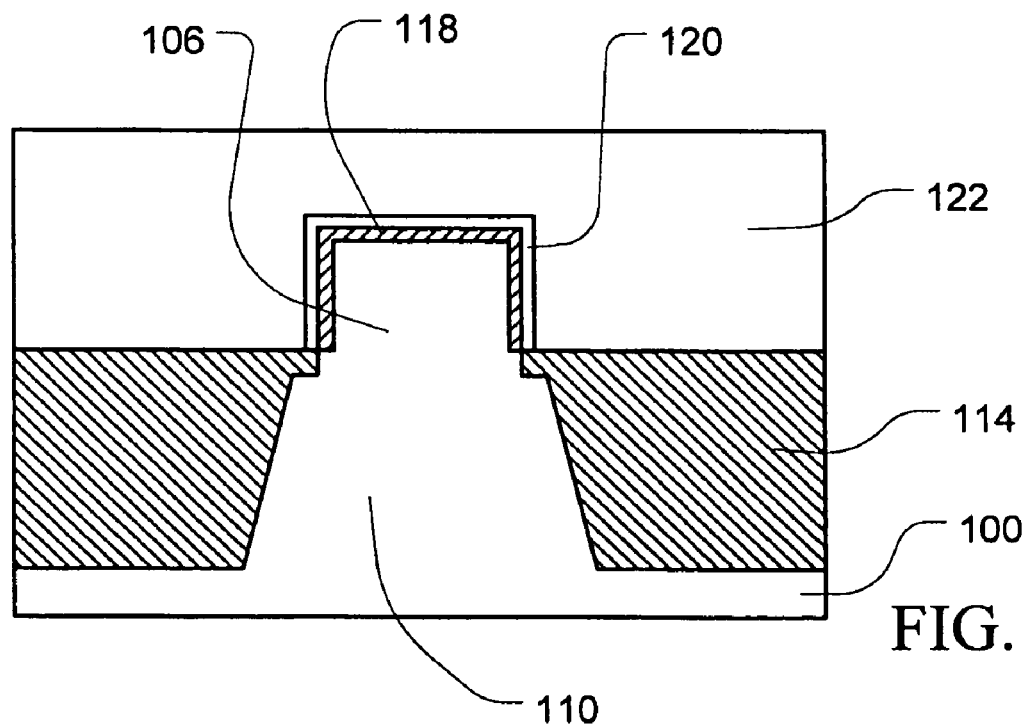

As illustrated in FIG. 2G, the exposed portion of the first pattern 106 may then be subjected to an ion implantation process during which a predetermined dose of one or more dopant species 116 are implanted to establish the electrical characteristics of the channel region 118. As illustrated in FIG. 2H, following the ion implant process, a gate dielectric 120, for example a 5-50 Å layer of silicon dioxide, may be formed on the exposed portions of the first pattern and a gate electrode 122 may be formed on the gate dielectric.

Although the gate electrode is, for convenience, illustrated as a homogeneous material, those of ordinary skill in the art will appreciate that a variety of conventional materials and processes may be utilized to produce a gate electrode structure having multiple layers of different materials to control certain of the electrical performance characteristics of the resulting devices. Another ion implant process may then be utilized to set the doping of the source/drain regions controlled by the gate electrode. Conventional metallization processes may then be employed to connect the discrete elements formed on the substrate 100 to provide the desired functionality in the completed device.

Figure 3A:
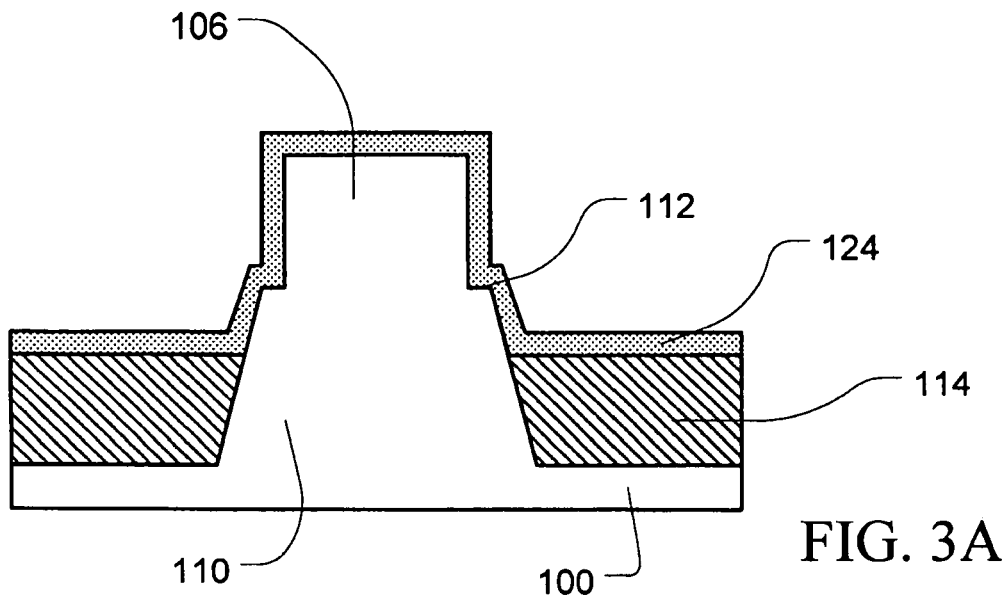
FIGS. 3A-E illustrate the manufacture of a FinFET according to a second exemplary embodiment of the invention.

As illustrated in FIGS. 3A-E, a second exemplary method for manufacturing FinFET devices incorporating the exemplary fin configuration parallels the first exemplary method as described above with reference to FIGS. 2A-2E. As illustrated in FIG. 3A, however, in the second exemplary embodiment, more of the insulating layer 114 is removed, thereby exposing the first pattern 106, the step portion 112 and an upper portion of the second pattern 110. Additional layers of material may then be formed on the substrate, including, for example a relatively thin, 50-300 Å, oxide layer (not illustrated), a thicker nitride layer 124 and a second insulating fill layer 126.

Figure 3B:
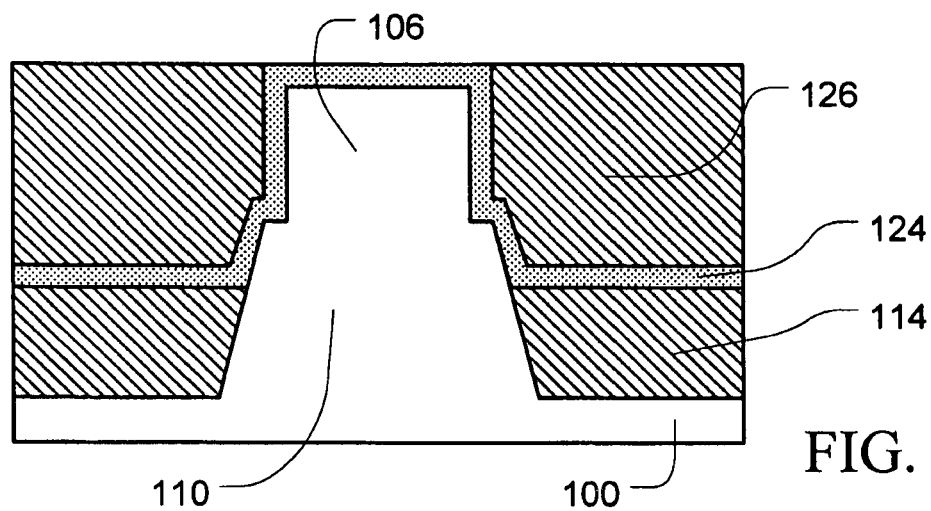
Figure 3C:
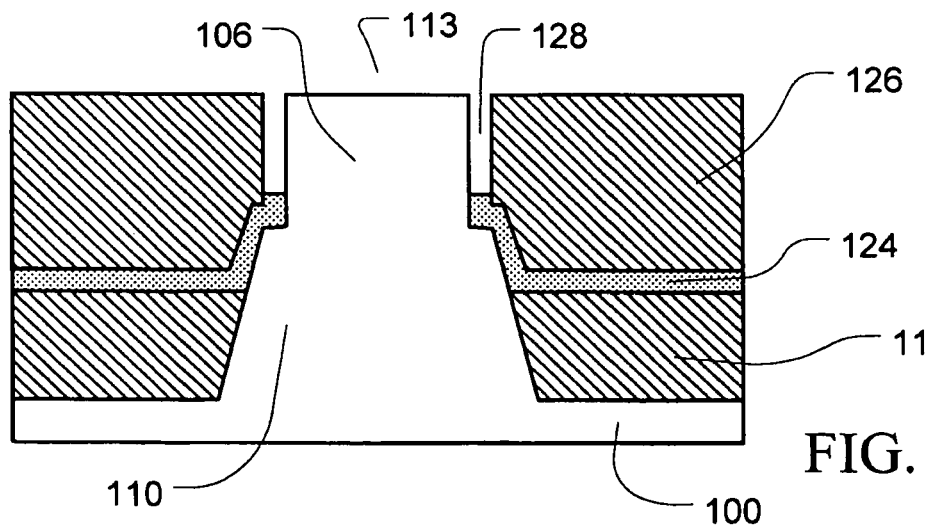

As illustrated in FIGS. 3B-C, upper portions of one or more of these additional layers may be removed to expose the nitride layer 124 or the nitride layer and the semiconductor fin structure 113. A portion of the nitride layer 124 and, if present, any buffer layer(s) adjacent the sidewalls of the first pattern 106 of the semiconductor fin structure 113 may then be removed to form openings 128 between the substantially vertical sidewalls of the semiconductor fin structure and the remaining portion of the second insulating fill layer 126.

Figure 3D:
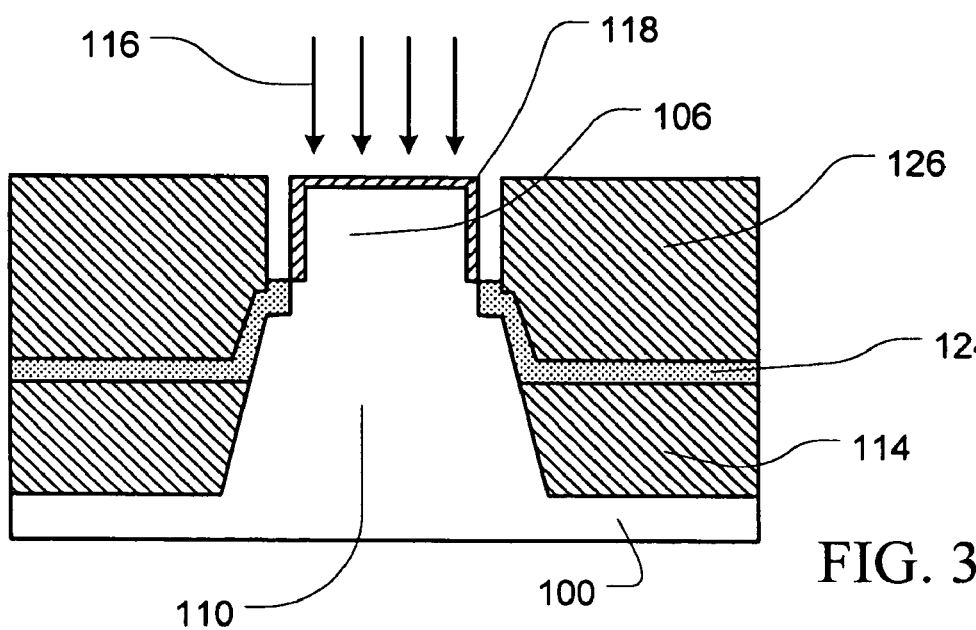
Figure 3E:
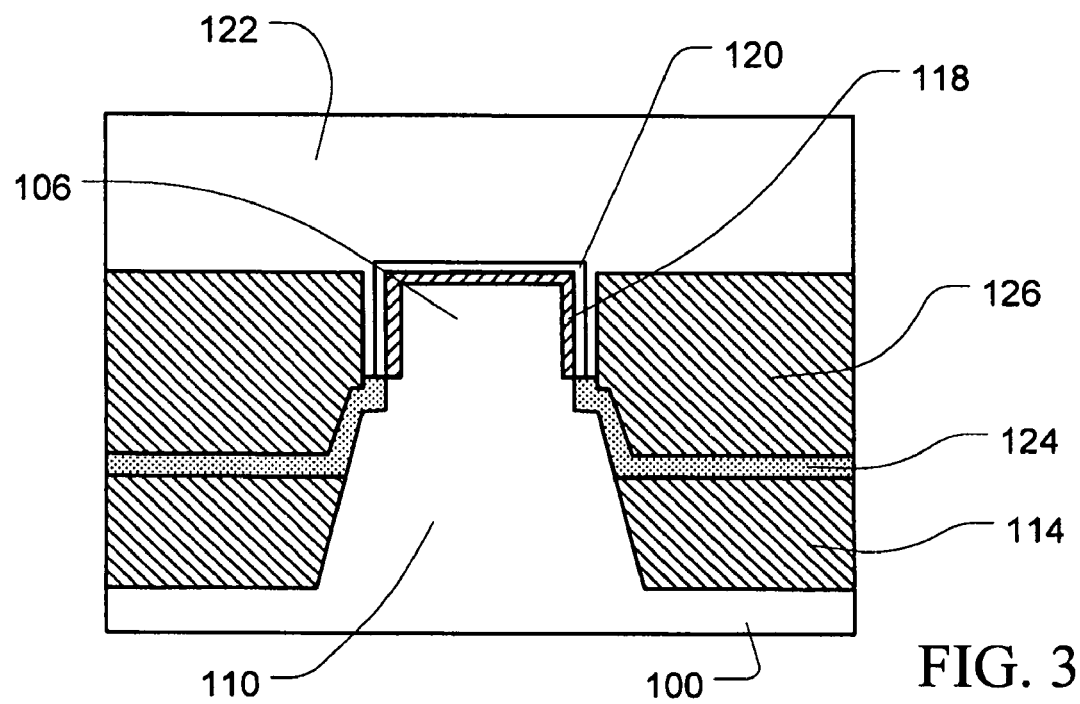

As illustrated in FIG. 3D, the exposed portion of the first pattern 106 may then be subjected to an ion implantation process during which a predetermined dose of one or more dopant species 116 are implanted to establish the electrical characteristics of the channel region 118. As illustrated in FIG. 3E, following the ion implant process, a gate dielectric 120, for example a 5-50 Å layer of silicon dioxide, may be formed on the exposed portions of the first pattern and a gate electrode 122 may be formed on the gate dielectric.

Although the gate electrode is, for convenience, illustrated as a homogeneous material, those of ordinary skill in the art will appreciate that a variety of conventional materials and processes may be utilized to produce a gate electrode structure having multiple layers of different materials to control certain of the electrical performance characteristics of the resulting devices. Another ion implant process may then be utilized to set the doping of the source/drain regions controlled by the gate electrode. Conventional metallization processes may then be employed to connect the discrete elements formed on the substrate 100 to provide the desired functionality in the completed device.

Figure 4A:
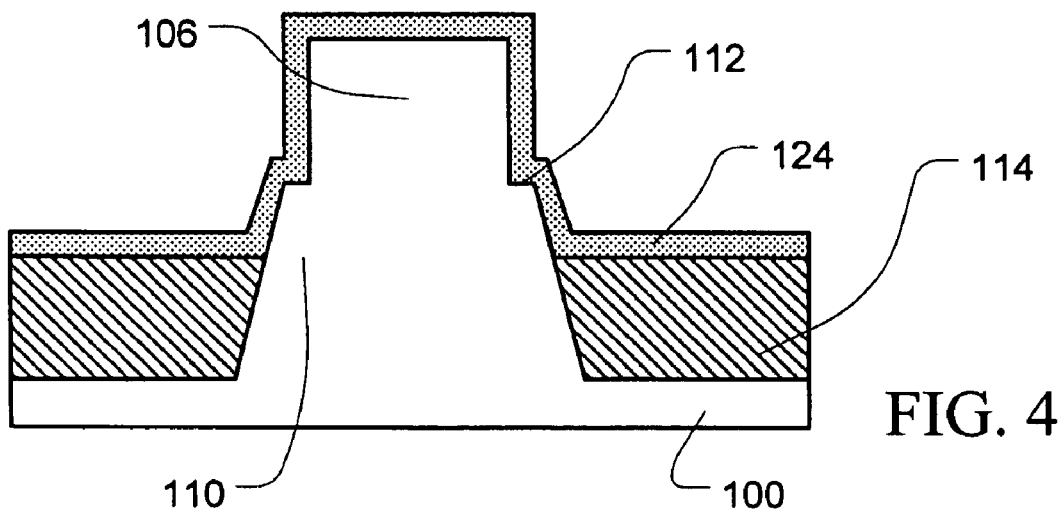
FIGS. 4A-E illustrate the manufacture of a FinFET according to a third exemplary embodiment of the invention.

As illustrated in FIGS. 4A-E, a third exemplary method for manufacturing FinFET devices incorporating the exemplary fin configuration parallels the first exemplary method as described above with reference to FIGS. 2A-2E. As illustrated in FIG. 4A, however, in the third exemplary embodiment, more of the insulating layer 114 is removed, thereby exposing the first pattern 106, the step portion 112 and an upper portion of the second pattern 110. Additional layers of material may then be formed on the substrate, including, for example a relatively thin, 50-300 Å, oxide layer (not illustrated), a thicker nitride layer 124 and a second insulating fill layer 126.

Figure 4B:
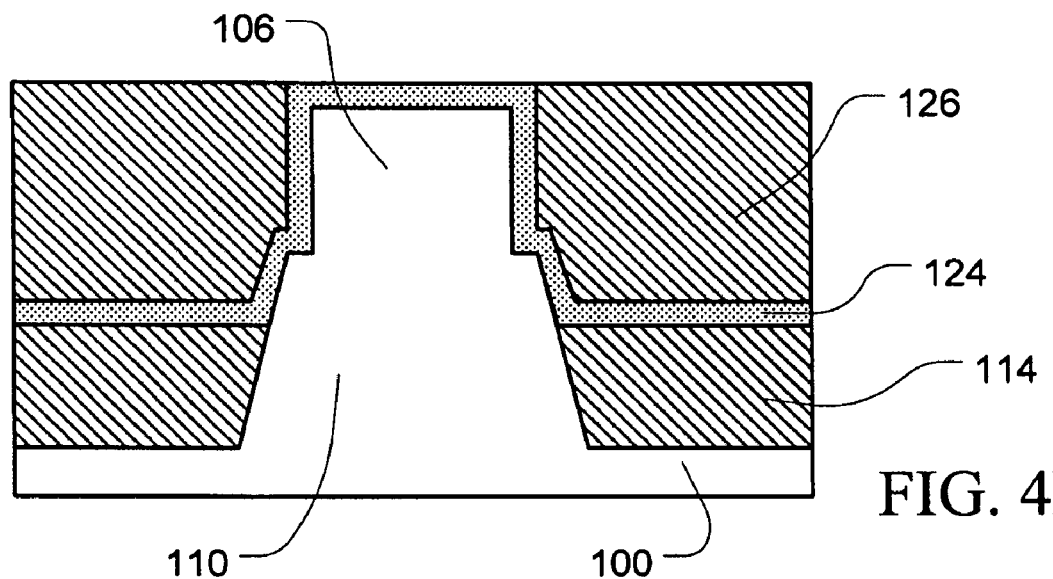
Figure 4C:
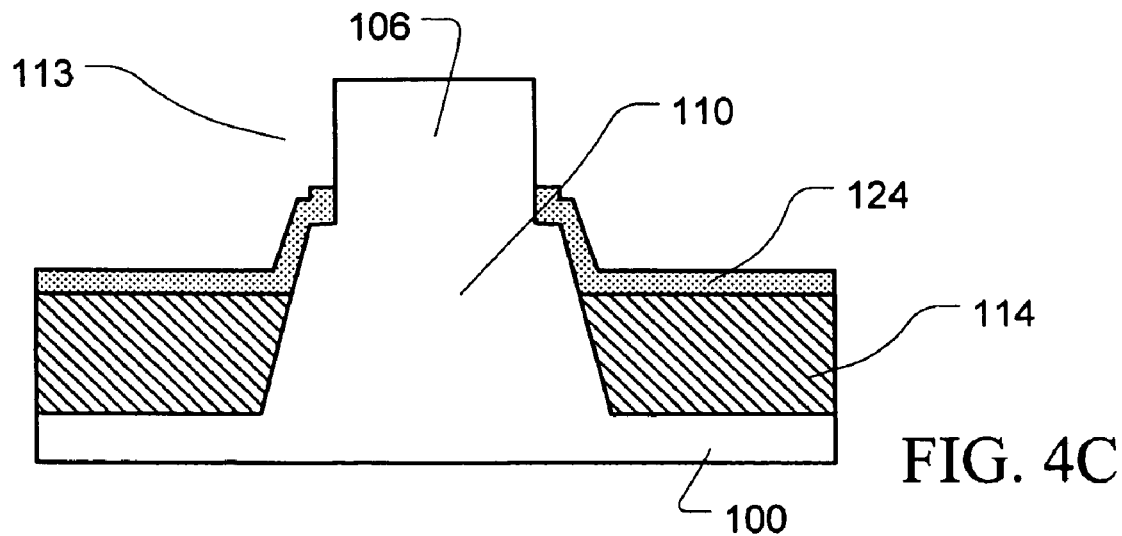

As illustrated in FIGS. 4B-C, upper portions of one or more of these additional layers may be removed to expose the nitride layer 124 or the nitride layer and the semiconductor fin structure 113. A portion of the nitride layer 124 and, if present, any buffer layer(s) adjacent the sidewalls of the first pattern 106 of the semiconductor fin structure 113 may then be removed to form openings between the substantially vertical sidewalls of the semiconductor fin structure and the remaining portion of the second insulating fill layer 126. As illustrated in FIG. 4C, however, the remaining portion of the second insulating fill layer 126 is then removed to expose the remainder of the nitride film 124.

Figure 4D:
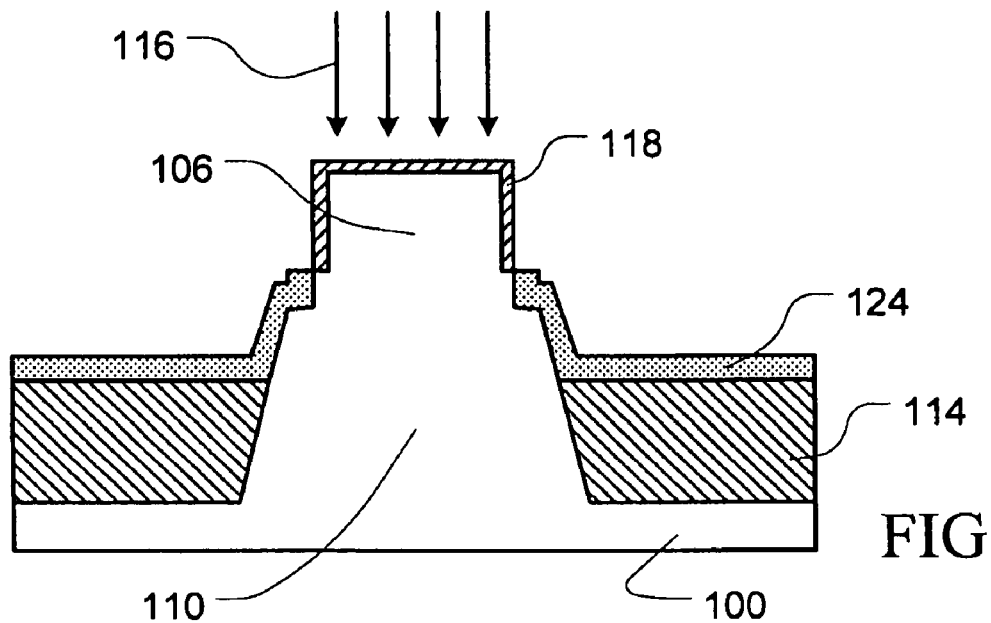
Figure 4E:
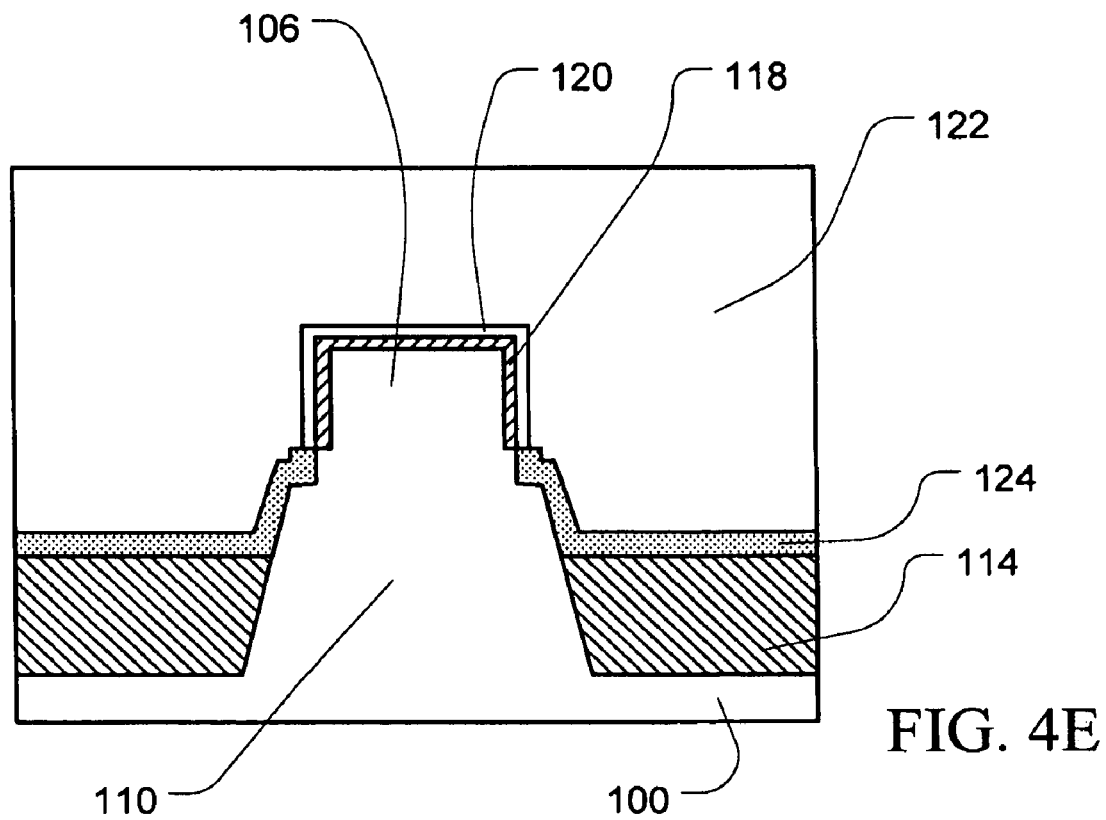

As illustrated in FIG. 4D, the exposed portion of the first pattern 106 may then be subjected to an ion implantation process during which a predetermined dose of one or more dopant species 116 are implanted to establish the electrical characteristics of the channel region 118. As illustrated in FIG. 4E, following the ion implant process, a gate dielectric 120, for example a 5-50 Å layer of silicon dioxide, may be formed on the exposed portions of the first pattern and a gate electrode 122 may be formed on the gate dielectric.

Although the gate electrode is, for convenience, illustrated as a homogeneous material, those of ordinary skill in the art will appreciate that a variety of conventional materials and processes may be utilized to produce a gate electrode structure having multiple layers of different materials to control certain of the electrical performance characteristics of the resulting devices. Another ion implant process may then be utilized to set the doping of the source/drain regions controlled by the gate electrode. Conventional metallization processes may then be employed to connect the discrete elements formed on the substrate 100 to provide the desired functionality in the completed device.

Figure 5A:
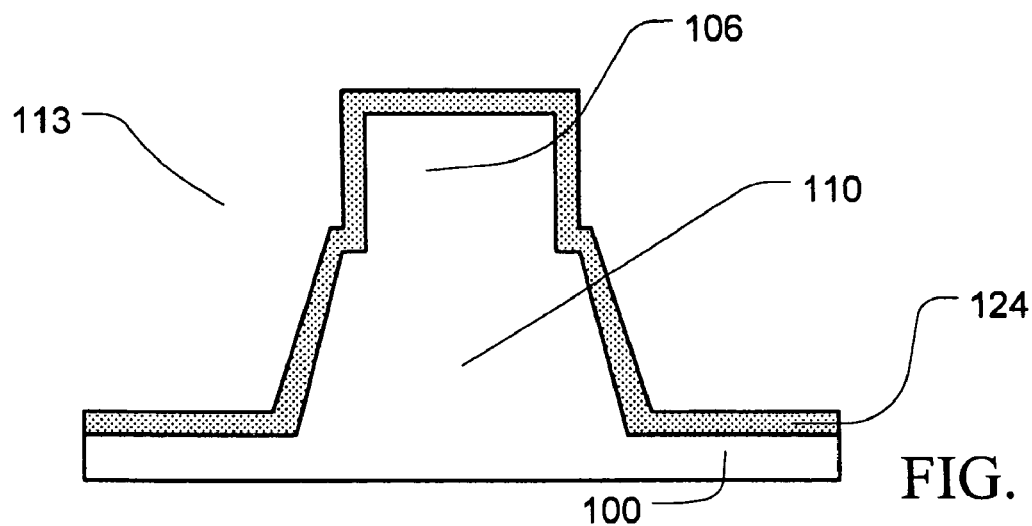
FIGS. 5A-E illustrate the manufacture of a FinFET according to a fourth exemplary embodiment of the invention.

As illustrated in FIGS. 5A-E, a fourth exemplary method for manufacturing FinFET devices incorporating the exemplary fin configuration parallels the first exemplary method as described above with reference to FIGS. 2A-2D. As illustrated in FIG. 5A, however, in the fourth exemplary embodiment, after the sidewall spacers 108 and the etch mask pattern 101 are removed to expose the first pattern 106, the step portion 112 and the second pattern 110, additional layers of material may then be formed on the substrate, including, for example a relatively thin, 50-300 Å, oxide layer (not illustrated) and a thicker nitride layer 124.

Figure 5B:
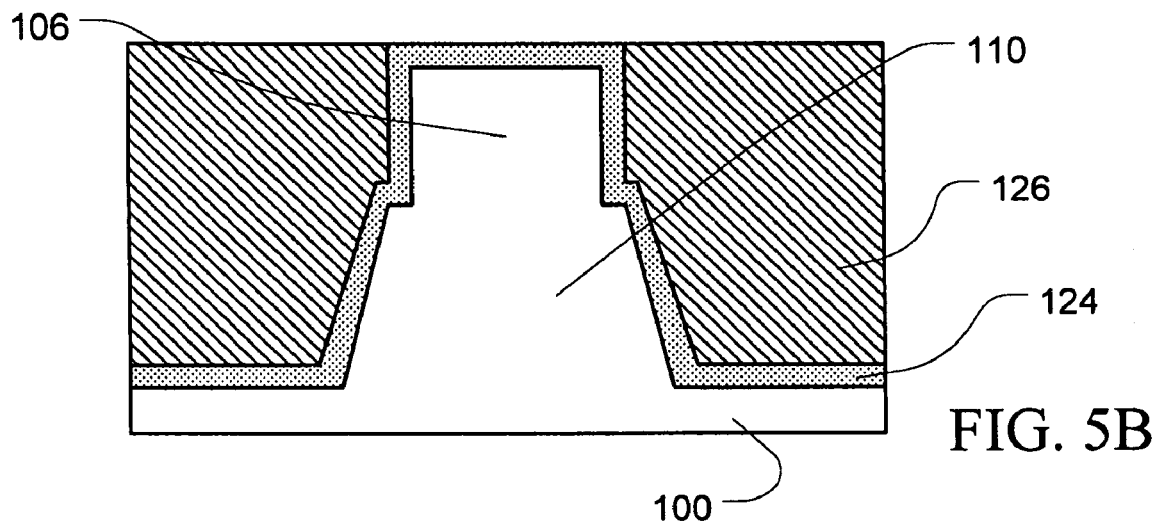
Figure 5C:
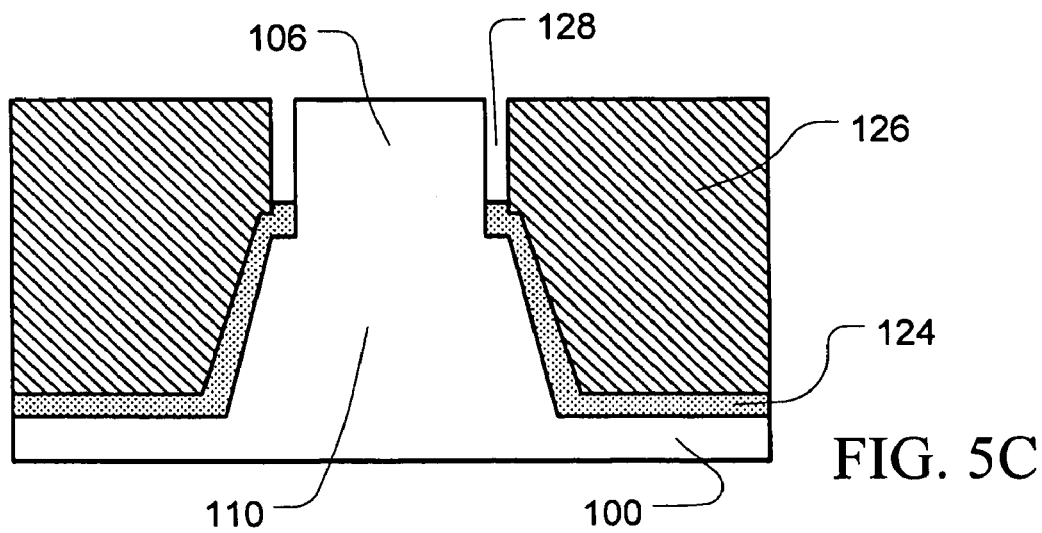

As illustrated in FIGS. 5B-C, an insulating layer 114 may then be formed on the nitride layer 124 and upper portions of one or more of the insulating and nitride layers may be removed to expose the nitride layer 124 or the nitride layer and the semiconductor fin structure 113. A portion of the nitride layer 124 and, if present, any buffer layer(s) adjacent the sidewalls of the first pattern 106 of the semiconductor fin structure 113 may then be removed to form openings 128 between the substantially vertical sidewalls of the semiconductor fin structure and the remaining portion of the insulating layer 126.

Figure 5D:
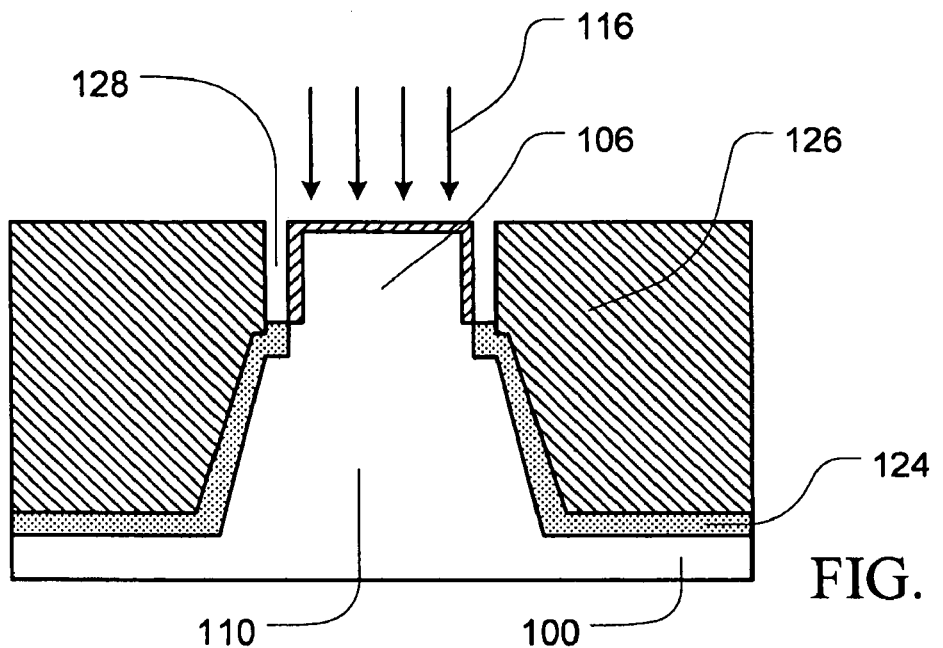
Figure 5E:
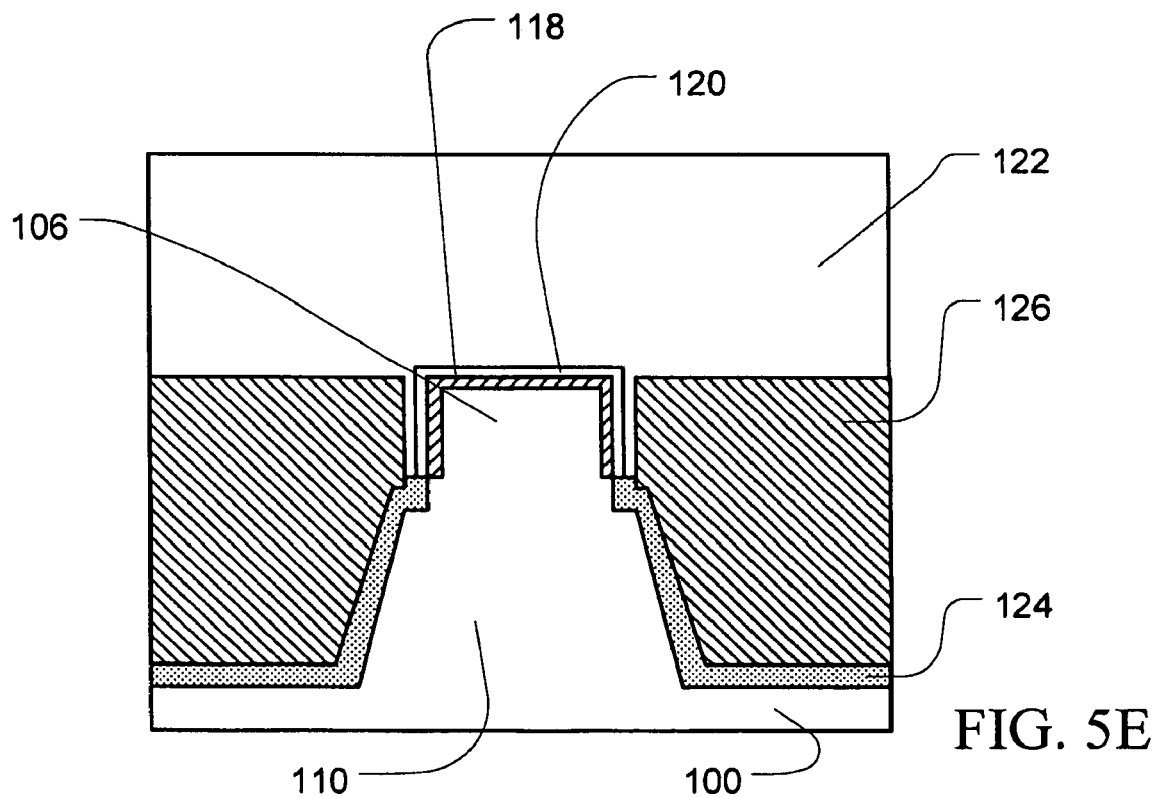

As illustrated in FIG. 5D, the exposed portion of the first pattern 106 may then be subjected to an ion implantation process during which a predetermined dose of one or more dopant species 116 are implanted to establish the electrical characteristics of the channel region 118. As illustrated in FIG. 5E, following the ion implant process, a gate dielectric 120, for example a 5-50 Å layer of silicon dioxide, may be formed on the exposed portions of the first pattern and a gate electrode 122 may be formed on the gate dielectric.

Although the gate electrode is, for convenience, illustrated as a homogeneous material, those of ordinary skill in the art will appreciate that a variety of conventional materials and processes may be utilized to produce a gate electrode structure having multiple layers of different materials to control certain of the electrical performance characteristics of the resulting devices. Another ion implant process may then be utilized to set the doping of the source/drain regions controlled by the gate electrode. Conventional metallization processes may then be employed to connect the discrete elements formed on the substrate 100 to provide the desired functionality in the completed device.

Figure 6A:
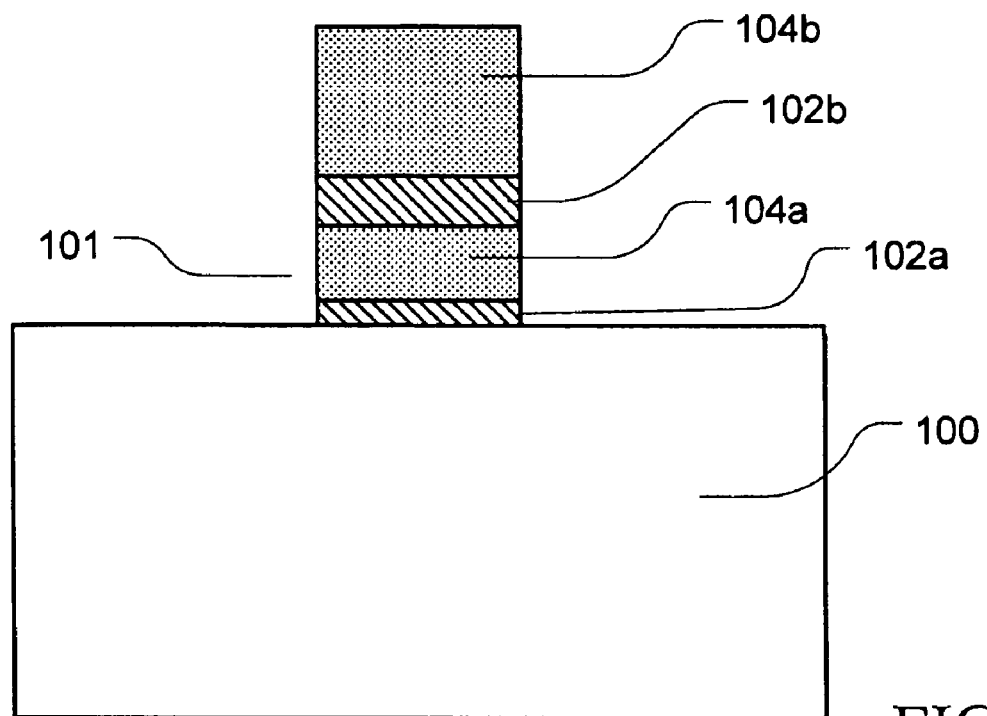
FIGS. 6A-J illustrate the manufacture of a FinFET according to a fifth exemplary embodiment of the invention.

As illustrated in FIG. 6A, a fifth exemplary method for manufacturing FinFET devices incorporating the exemplary fin configuration starts with a semiconductor substrate 100, such as silicon. The substrate utilized may be selected from a range of substrate configurations including CZ-grown single crystal bulk silicon substrates and modified substrates including, for example, substrates incorporating one or more features such as epitaxial layers, buried insulating layers or doped regions selected to provide the desired structural and performance characteristics in the completed device.

An etch mask pattern 101, typically including a buffer layer 102a, such as 50-200 Å of silicon dioxide, formed directly on the substrate 100, a second layer 104a, such as 200-400 Å of silicon nitride, a third layer 102b, such as 200-400 Å of silicon dioxide, and a fourth layer 104b, such as 500-1000 Å formed on the buffer layer. These layers may then be patterned and etched using conventional photolithographic and dry and/or wet etches to form the etch mask pattern 101.

Figure 6B:
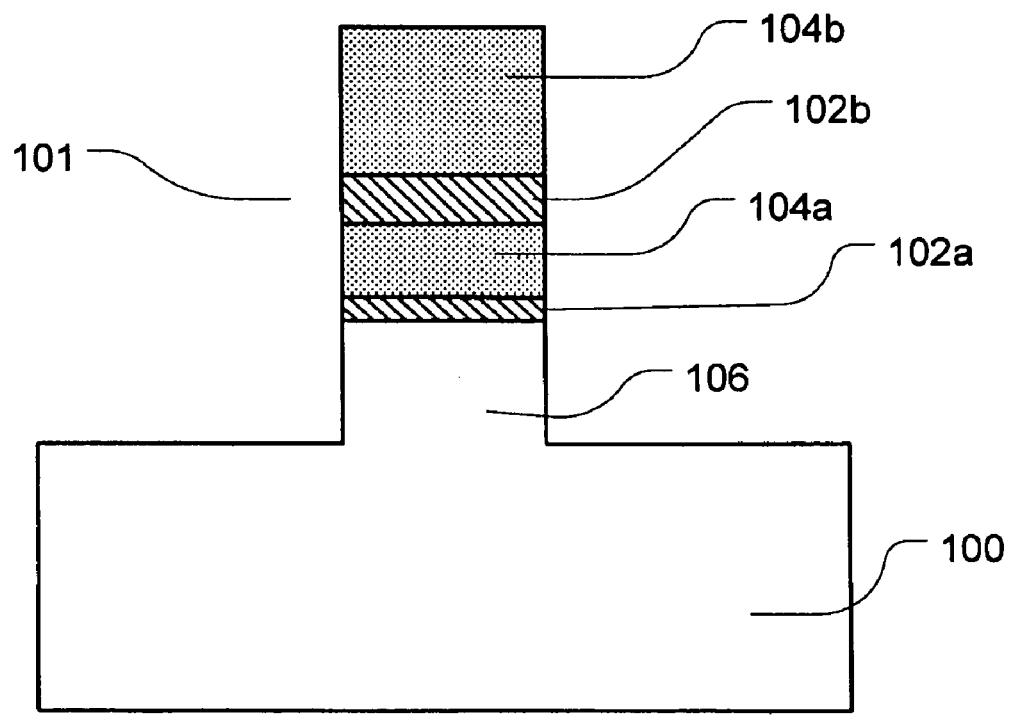
Figure 6C:
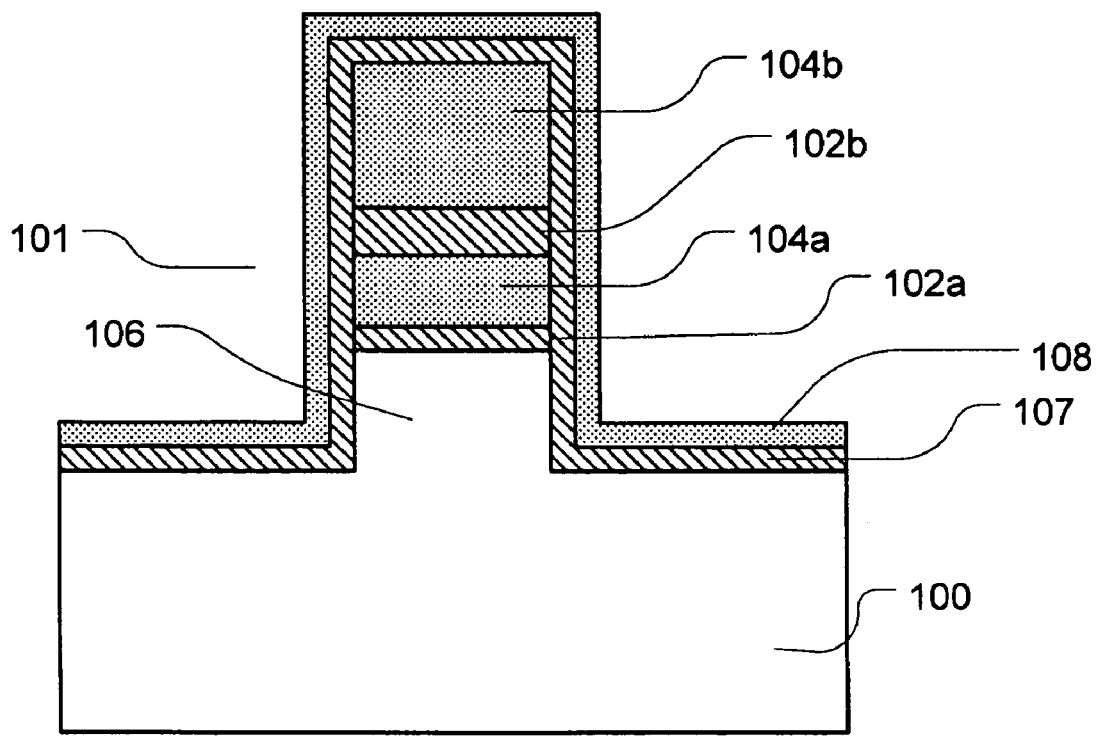
Figure 6D:
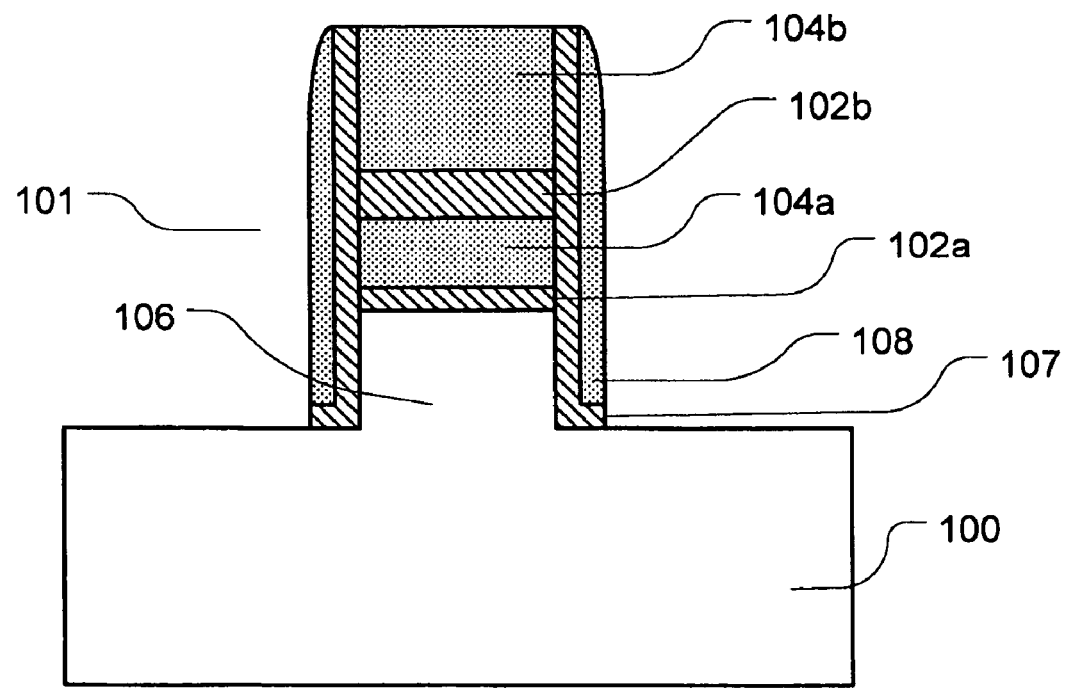

As illustrated in FIG. 6B, once the etch pattern has been formed, a portion, for example 500-1500 Å, of the unprotected substrate 100 is removed to form a first pattern 106. The combination of etch gases and etch conditions used to form the first pattern 106 are preferably selected to produce substantially vertical sidewalls on the first pattern. As illustrated in FIG. 6C, once the first pattern 106 has been formed, material may be deposited for forming sidewall spacers and may include a buffer layer 107 of 50-400 Å of silicon dioxide and an upper layer 108 of 50-300 Å of silicon nitride. As illustrated in FIG. 6D, sidewall spacers may then be formed on the first pattern 106, by using an etch back process to remove substantially all of the horizontal portions of layers 107 and 108 while leaving the vertical portions adjacent the sidewalls of the first pattern 106.

Figure 6E:
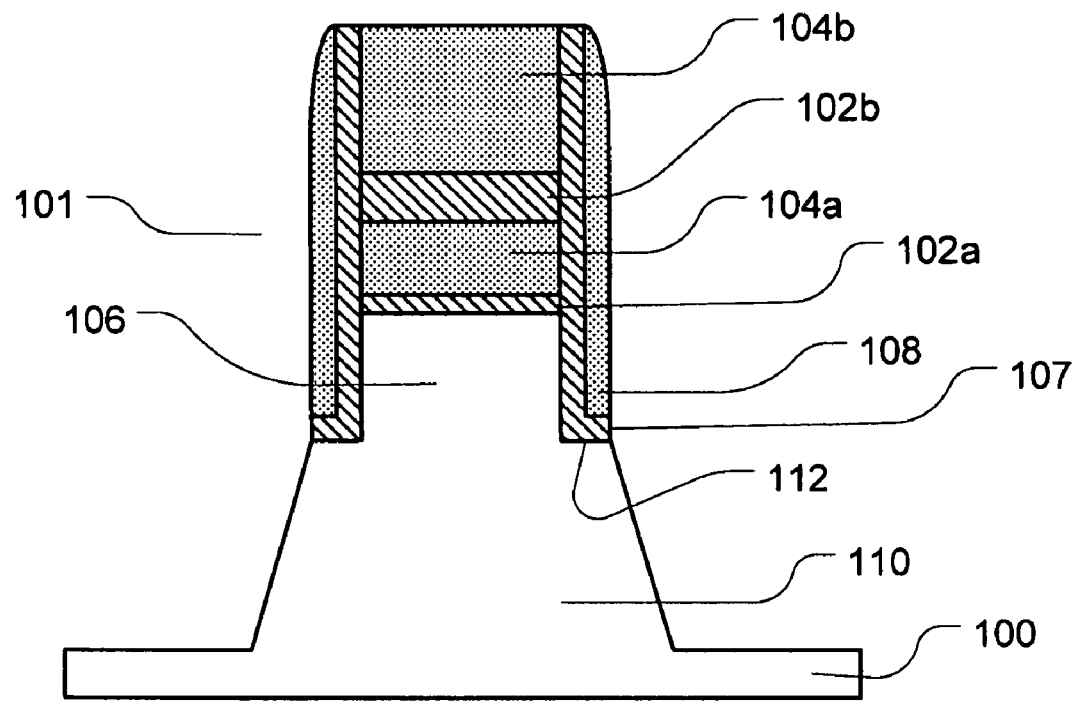

As illustrated in FIG. 6E, after forming the sidewall spacers, another portion, for example 1000-4500 Å, of the unprotected substrate 100 is removed to form a second pattern 110. The combination of etch gases and etch conditions used to form the second pattern are preferably selected to produce a non-vertical, bell-shaped or inclined sidewall configuration that may form an angle with a plane defined by the substrate of between about 75 and 89 degrees, more typically between about 84 and 88 degrees.

The resulting semiconductor fin structure 113 will include both a first pattern 106 portion having substantially vertical sidewalls and a second pattern 110 portion having inclined sidewalls, with the demarcation between the two patterns being indicated by a generally horizontal step portion 112, the width of which will largely be determined by the thickness of the sidewall spacers. The third 102b and fourth 104b layers of the mask pattern 101 and the remaining portions of films 107 and 108 that had formed the sidewall structures during the second pattern etch may then be removed to obtain a semiconductor fin structure incorporating a mask layer on the upper surface of the fin structure suitable for further processing.

Figure 6F:
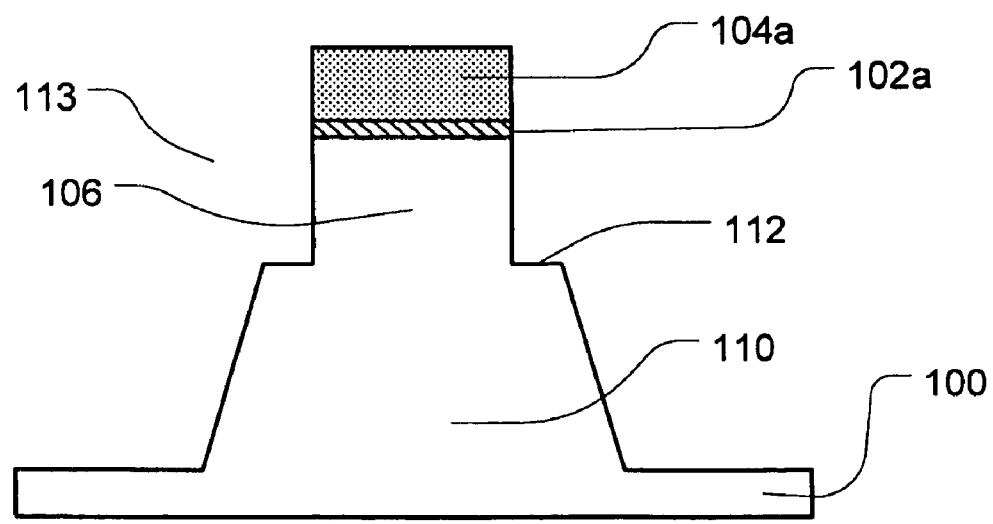
Figure 6G:
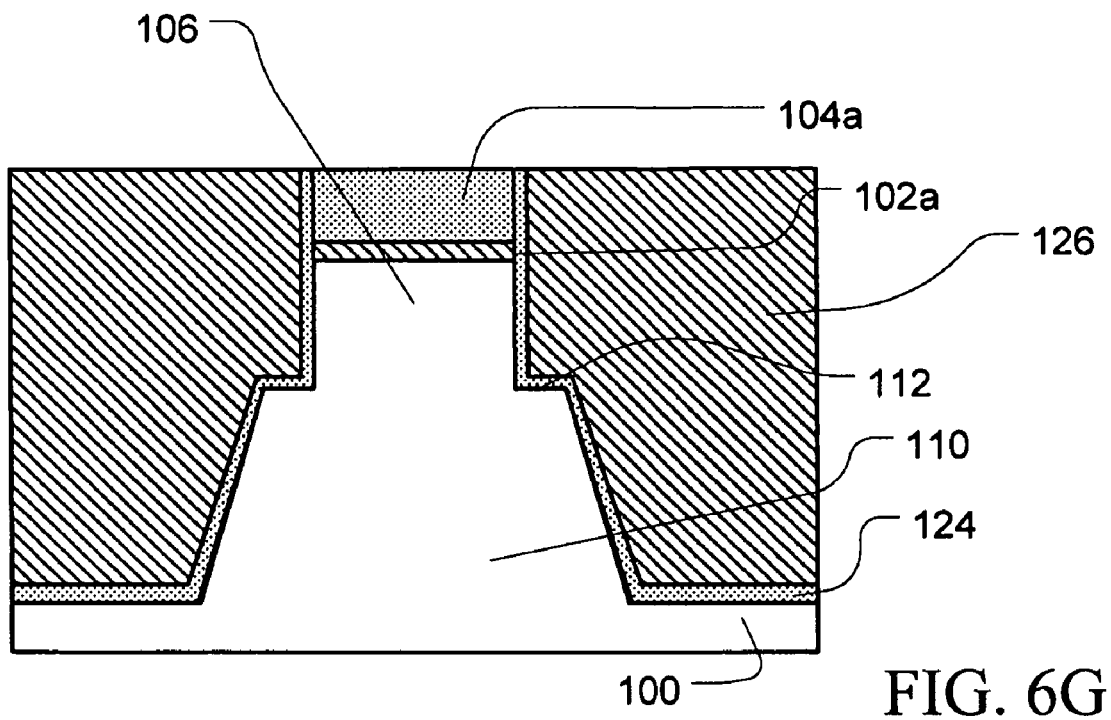

As illustrated in FIG. 6F, the upper two layers of the mask layer pattern 101 and the sidewall structures 108 have been removed from the fin structure. As shown in FIG. 6G, a thin insulating layer 128, such as silicon nitride, and thicker insulating layer 114, such as silicon dioxide, can be formed on the substrate 100 to fill the spaces between adjacent fin structures. Although illustrated as a generally homogeneous film, those of ordinary skill in the art will appreciate that the insulating layer 114 may incorporate one than one layer and more than one insulating material. Particularly when conformal films are utilized to form insulating layer 114, an upper portion of the insulating layer may be removed to expose an upper surface of the masking layer on the fin structure 113 and/or provide a planarized surface for subsequent processing. As illustrated in FIG. 6G, for example, an upper portion of the insulating layer 114 may be removed to expose a portion of the thin insulating layer 128 adjacent masking layer on the semiconductor fin structure 113.

Figure 6H:
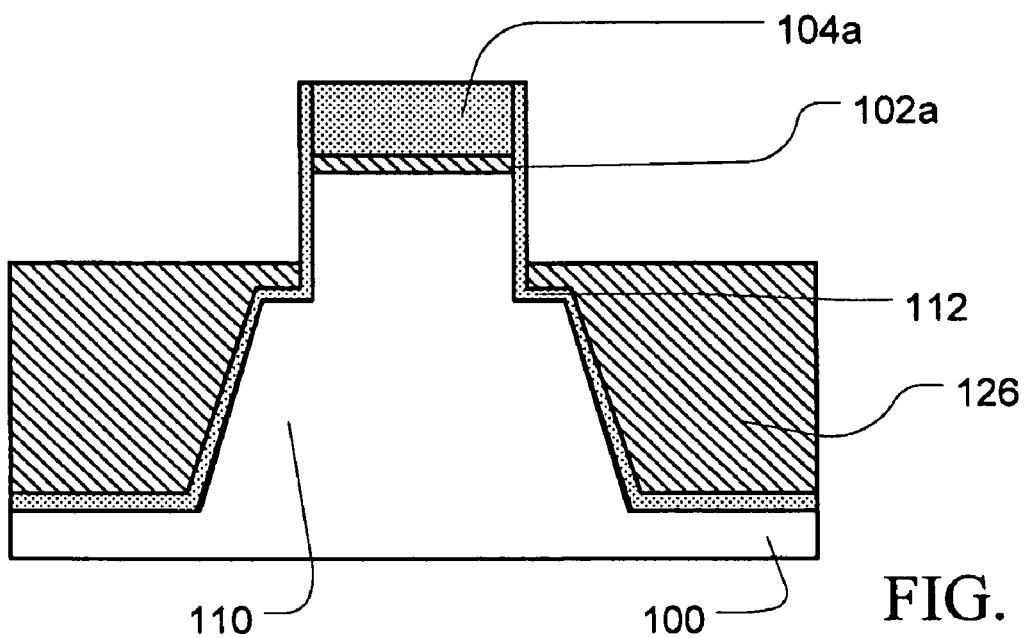
Figure 6I:
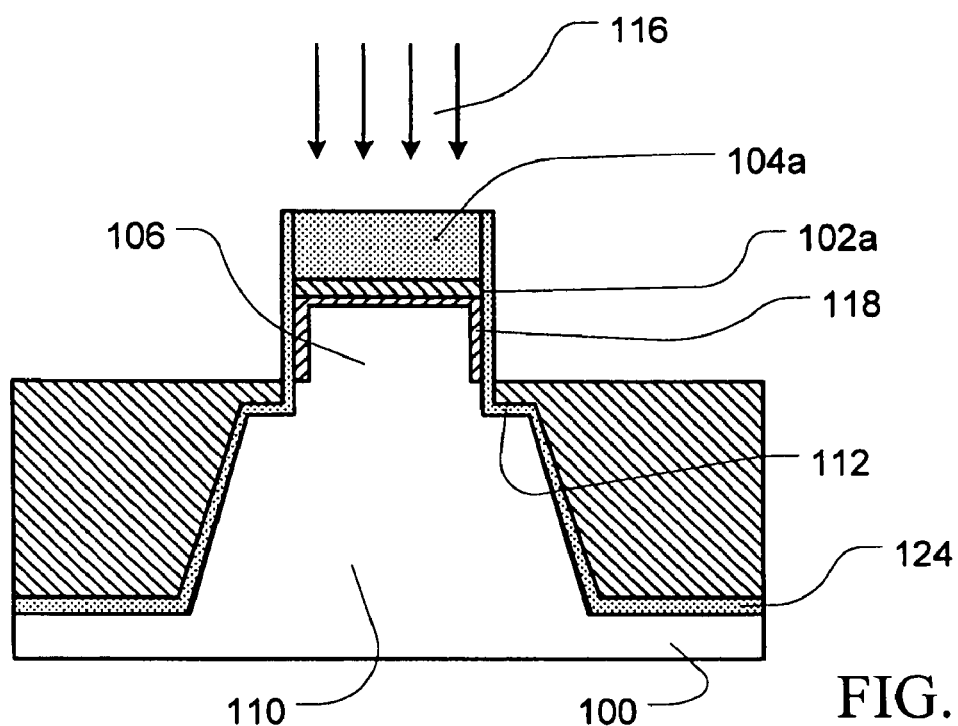
Figure 6J:
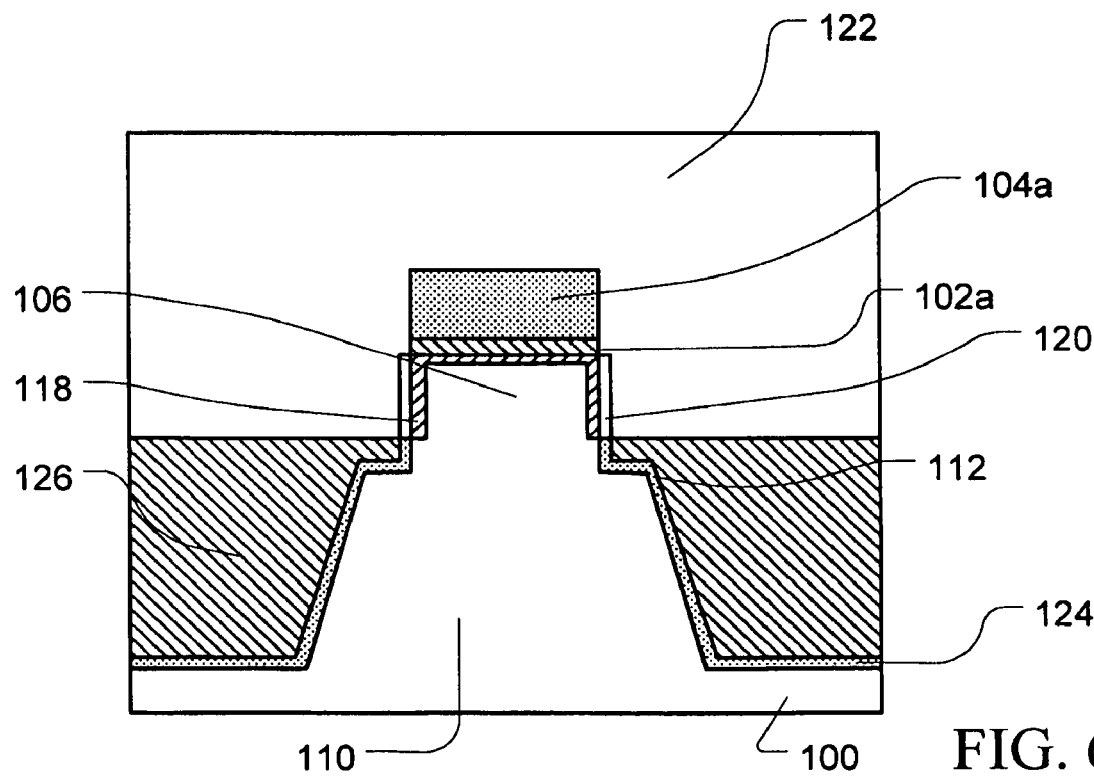

As illustrated in FIG. 6H, a portion of the insulating layer 114 and, optionally, a portion of the thin insulating layer 128 to expose portions of the first pattern 106. The exposed portions of the first pattern 106 may then be subjected to an ion implantation process during which a predetermined dose of one or more dopant species 116 are implanted to establish the electrical characteristics of the channel region 118. As illustrated in FIG. 6I, following the ion implant process, a gate dielectric 120, for example a 5-50 Å layer of silicon dioxide, may be formed on the exposed portions of the first pattern and a gate electrode 122 may be formed on the gate dielectric.

Although the gate electrode is, for convenience, illustrated as a homogeneous material, those of ordinary skill in the art will appreciate that a variety of conventional materials and processes may be utilized to produce a gate electrode structure having multiple layers of different materials to control certain of the electrical performance characteristics of the resulting devices. Another ion implant process may then be utilized to set the doping of the source/drain regions controlled by the gate electrode. Conventional metallization processes may then be employed to connect the discrete elements formed on the substrate 100 to provide the desired functionality in the completed device.

Figure 7:
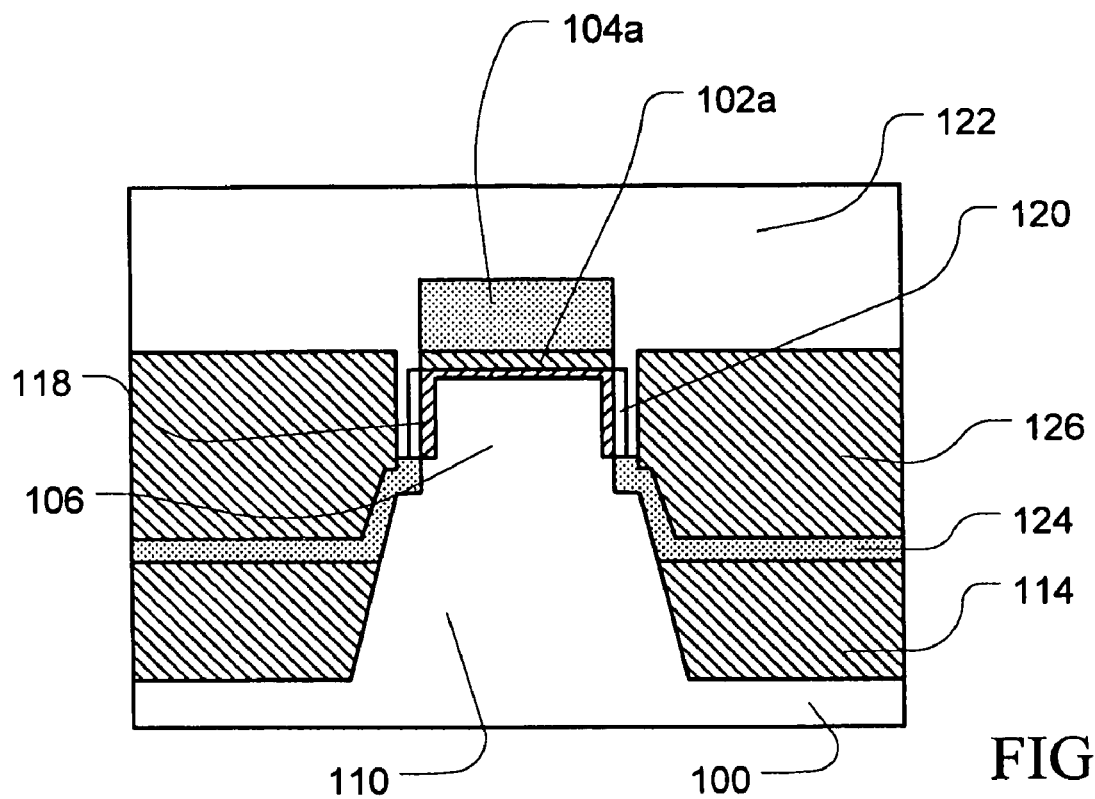
FIG. 7 illustrates a FinFET according to a sixth exemplary embodiment of the invention.

As illustrated in FIG. 7, a sixth exemplary method for manufacturing FinFET devices incorporating the exemplary fin configuration parallels the fifth exemplary method as described above with reference to FIGS. 6A-6F. As illustrated in FIG. 7, however, in the sixth exemplary embodiment, as in the second embodiment described above, a greater thickness of the insulating layer 114 is removed, thereby exposing the first pattern 106, the step portion 112 and an upper portion of the second pattern 110. Additional layers of material may then be formed on the substrate, including, for example a relatively thin, about 50-300 Å, oxide layer, a thicker nitride layer 124 and a second insulating fill layer 126.

The upper portions of these additional layers may then be removed to expose the nitride layer 124 or the nitride layer and the masking layer on the semiconductor fin structure 113. A portion of the nitride layer 124 and, if present, any buffer layer(s) adjacent the sidewalls of the first pattern 106 of the semiconductor fin structure 113 may then be removed to form openings 128 between the substantially vertical sidewalls of the semiconductor fin structure and the remaining portion of the second insulating fill layer 126.

The exposed portion of the first pattern 106 may then be subjected to an ion implantation process during which a predetermined dose of one or more dopant species are implanted to establish the electrical characteristics of the channel region 118. As illustrated in FIG. 7, following the ion implant process, a gate dielectric 120, for example a 5-50 Å layer of silicon dioxide, may be formed on the exposed portions of the first pattern and a gate electrode 122 may be formed on the gate dielectric.

Although the gate electrode is, for convenience, illustrated as a homogeneous material, those of ordinary skill in the art will appreciate that a variety of conventional materials and processes may be utilized to produce a gate electrode structure having multiple layers of different materials to control certain of the electrical performance characteristics of the resulting devices. Another ion implant process may then be utilized to set the doping of the source/drain regions controlled by the gate electrode. Conventional metallization processes may then be employed to connect the discrete elements formed on the substrate 100 to provide the desired functionality in the completed device.

Figure 8:
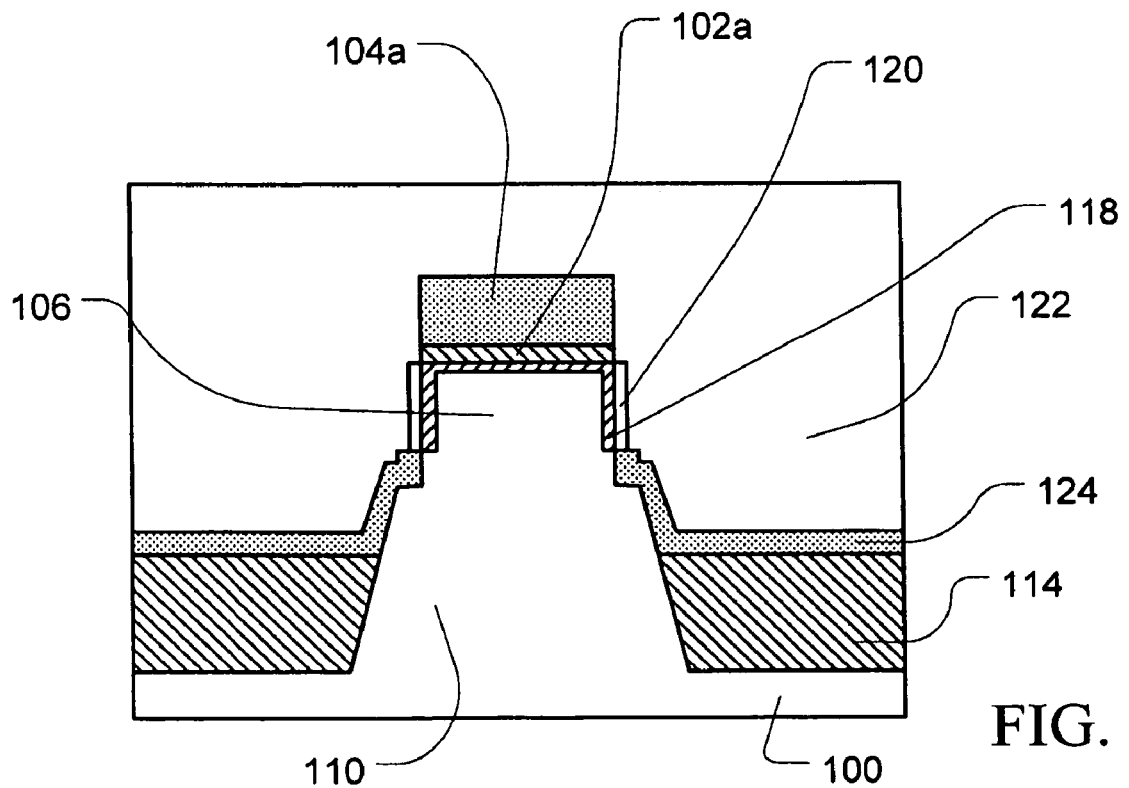
FIG. 8 illustrates a FinFET according to a seventh exemplary embodiment of the invention.

As illustrated in FIG. 8, a seventh exemplary method for manufacturing FinFET devices incorporating the exemplary fin configuration parallels the fifth exemplary method as described above with reference to FIGS. 6A-6F. In this exemplary embodiment, however, although initially similar to the sixth exemplary embodiment, more of the insulating layer 114 is removed, thereby exposing the first pattern 106, the step portion 112 and an upper portion of the second pattern 110. Additional layers of material may then be formed on the substrate, including, for example a relatively thin, 50-300 Å, oxide layer, a thicker nitride layer 124 and a second insulating fill layer 126.

The upper portions of one or more of these additional layers may be removed to expose the nitride layer 124 or the nitride layer and masking layer on the semiconductor fin structure 113. A portion of the nitride layer 124 and, if present, any buffer layer(s) adjacent the sidewalls of the first pattern 106 of the semiconductor fin structure 113 may then be removed to form openings between the substantially vertical sidewalls of the semiconductor fin structure and the remaining portion of the second insulating fill layer 126. Unlike the process described in connection with the sixth exemplary embodiment, however, the remaining portion of the second insulating fill layer 126 is then removed to expose the remainder of the nitride film 124.

As illustrated in FIG. 8, the exposed portion of the first pattern 106 may then be subjected to an ion implantation process during which a predetermined dose of one or more dopant species are implanted to establish the electrical characteristics of the channel region 118. Following the ion implant process, a gate dielectric 120, for example a 5-50 Å layer of silicon dioxide, may be formed on the exposed portions of the first pattern and a gate electrode 122 may be formed on the gate dielectric.

Although the gate electrode is, for convenience, illustrated as a homogeneous material, those of ordinary skill in the art will appreciate that a variety of conventional materials and processes may be utilized to produce a gate electrode structure having multiple layers of different materials to control certain of the electrical performance characteristics of the resulting devices. Another ion implant process may then be utilized to set the doping of the source/drain regions controlled by the gate electrode. Conventional metallization processes may then be employed to connect the discrete elements formed on the substrate 100 to provide the desired functionality in the completed device.

Figure 9:
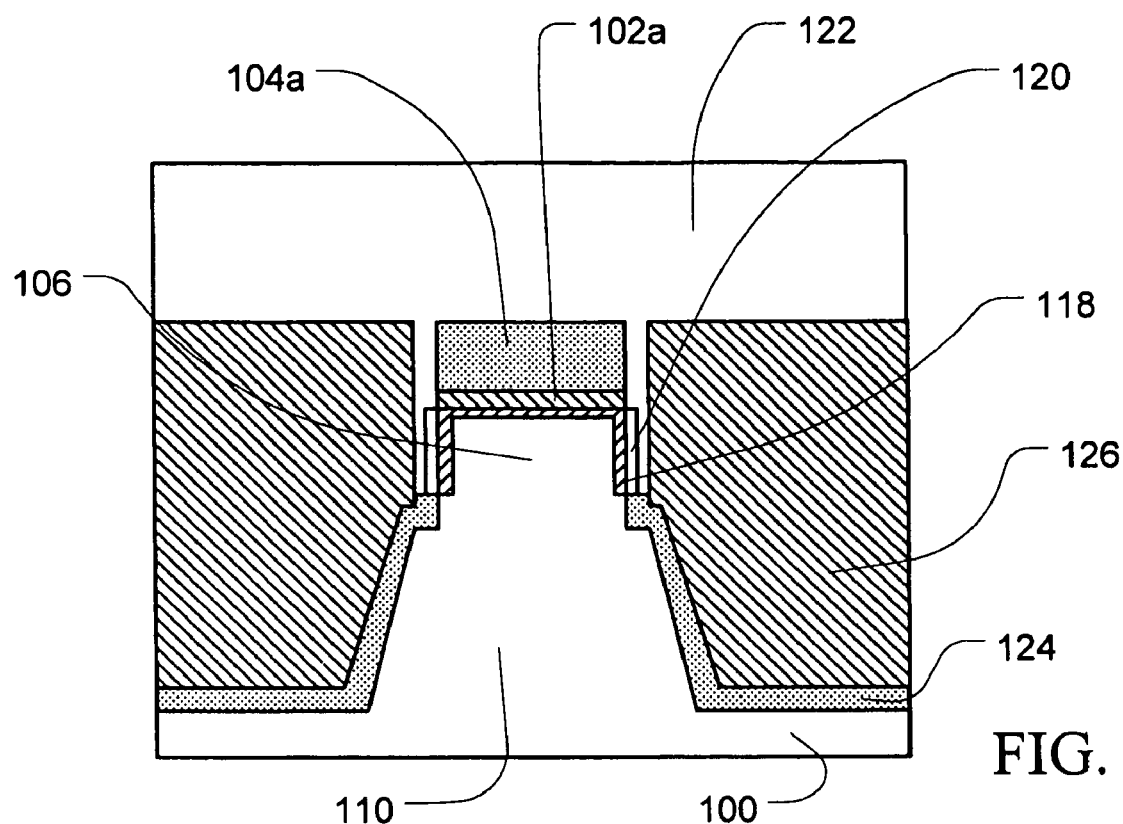
FIG. 9 illustrates a FinFET according to an eighth exemplary embodiment of the invention.
Figure 10:
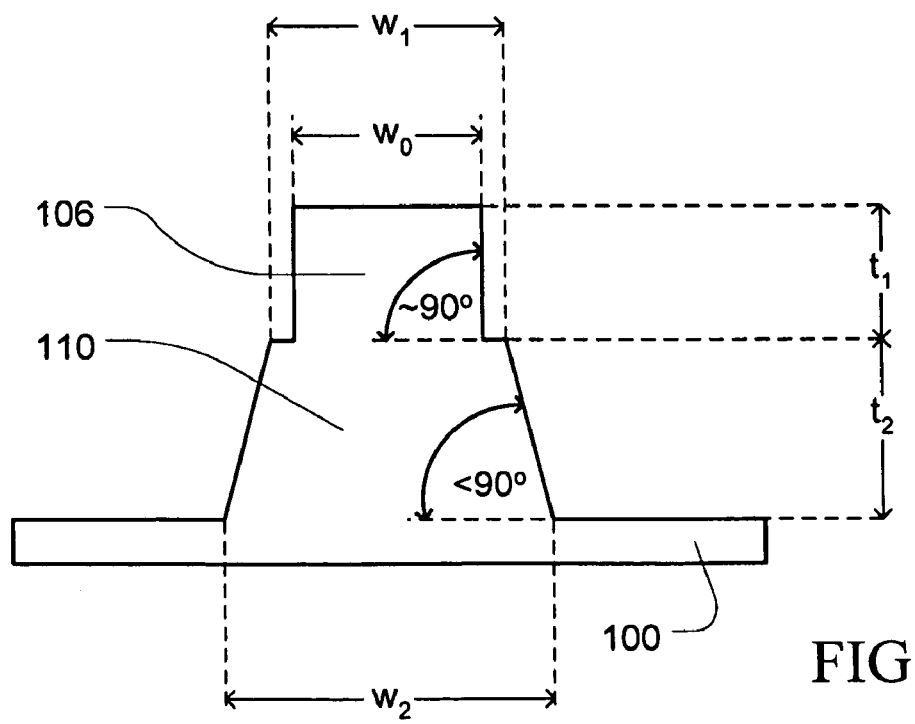
FIG. 10 illustrates reference points used to describe the cross-section of a fin structure according to exemplary embodiments of the invention.

As illustrated in FIG. 9, an eighth exemplary method for manufacturing FinFET devices incorporating the exemplary fin configuration parallels the fifth exemplary method as described above with reference to FIGS. 6A-6E. As illustrated in FIG. 9, however, in the eighth exemplary embodiment, after the sidewall spacers 108 and the etch mask pattern 101 are removed to expose the first pattern 106, the step portion 112 and the second pattern 110, additional layers of material may then be formed on the substrate, including, for example a relatively thin, 50-300 Å, oxide layer and a thicker nitride layer 124.

An insulating layer 114 may then be formed on the nitride layer 124 and upper portions of one or more of the insulating and nitride layers may be removed to expose the nitride layer 124 or the nitride layer and the masking layer on the semiconductor fin structure 113. A portion of the nitride layer 124 and, if present, any buffer layer(s) adjacent the sidewalls of the first pattern 106 of the semiconductor fin structure 113 may then be removed to form openings 128 between the substantially vertical sidewalls of the semiconductor fin structure and the remaining portion of the insulating layer 114.

As illustrated in FIG. 9, the exposed portion of the first pattern 106 may then be subjected to an ion implantation process during which a predetermined dose of one or more dopant species are implanted to establish the electrical characteristics of the channel region 118. Following the ion implant process, a gate dielectric 120, for example a 5-50 Å layer of silicon dioxide, may be formed on the exposed portions of the first pattern and a gate electrode 122 may be formed on the gate dielectric.

Although the gate electrode is, for convenience, illustrated as a homogeneous material, those of ordinary skill in the art will appreciate that a variety of conventional materials and processes may be utilized to produce a gate electrode structure having multiple layers of different materials to control certain of the electrical performance characteristics of the resulting devices. Another ion implant process may then be utilized to set the doping of the source/drain regions controlled by the gate electrode. Conventional metallization processes may then be employed to connect the discrete elements formed on the substrate 100 to provide the desired functionality in the completed device.

In each of the embodiments described above, the channel ion implant may be conducted with the ion beam angled to allow doping of the exposed side surfaces of the semiconductor fin structure. Those of ordinary skill in the implant arts will appreciate that the beam angle may be fixed or varied during the course of the ion implant process and that the orientation of the beam relative to the substrate being implanted may be adjusted mechanically and/or electrically to achieve this result, although with higher currents and higher energies mechanical solutions may be more useful. Similarly, the duration of the implant and the energy of the ion beam may be adjusted to achieve the desired doping levels in the appropriate surfaces of the substrate.

Although the invention has been described in detail with respect to a series of exemplary embodiments, those of ordinary skill in the art will appreciate that various changes to the materials and thicknesses detailed above may be made without departing from the scope of the invention as defined by the following claims.

What is claimed is:

1. A method of manufacturing a semiconductor device, comprising:
    forming an etch mask pattern on a semiconductor substrate;
    removing a first thickness of the semiconductor substrate not protected by the etch mask pattern to form an upper semiconductor pattern, wherein a first set of etch conditions are selected to produce substantially vertical sidewalls on the upper semiconductor pattern; and
    removing a second thickness of the semiconductor substrate not protected by the etch mask pattern to form a lower semiconductor pattern, wherein a second set of etch conditions are selected to produce inclined sidewalls on the lower semiconductor pattern, the upper semiconductor pattern and the lower semiconductor pattern cooperating to form a final semiconductor pattern;
    wherein a portion of the upper semiconductor pattern forms a channel region for a transistor having at least two gates arranged on opposite sides of the upper semiconductor pattern.

2. A method of manufacturing a semiconductor device according to claim 1, wherein:
    the semiconductor substrate consists essentially of single crystal silicon having a substantially uniform initial dopant concentration.

3. A method of manufacturing a semiconductor device according to claim 1, wherein:
    the semiconductor substrate includes an epitaxial silicon layer formed on bulk single crystal silicon.

4. A method of manufacturing a semiconductor device according to claim 3, wherein:
    the upper silicon pattern is formed in the epitaxial silicon layer; and
    the lower silicon pattern extends into the bulk single crystal silicon.

5. A method of manufacturing a semiconductor device according to claim 1, wherein:
    a ratio of the first thickness to the second thickness is between about 1:3 to about 3:1.

6. A method of manufacturing a semiconductor device according to claim 1, further comprising:
    forming an insulating layer, the insulating layer having a thickness greater than about $t_2$;

exposing a surface region of the upper semiconductor pattern;
implanting a dopant species into the exposed surface region;
forming a gate dielectric on the exposed surface region; and
forming a gate electrode on the gate dielectric.

7. A method of manufacturing a semiconductor device comprising:
   a) forming an etch mask pattern on a silicon substrate
   b) removing a first thickness $t_1$ of the silicon substrate not protected by the etch mask pattern to form an upper silicon pattern, wherein a first set of etch conditions are selected to produce substantially vertical sidewalls on the intermediate silicon pattern;
   c) forming spacer structures on the sidewalls of the intermediate silicon pattern;
   d) removing a second thickness $t_2$ of the silicon substrate not protected by the etch mask pattern and the spacer structures to form a lower silicon pattern, wherein a second set of etch conditions are selected to produce inclined sidewalls on the lower silicon pattern, the upper silicon pattern and the lower silicon pattern cooperating to form a final silicon pattern;
   e) depositing an insulating material on the final silicon pattern, the insulating material having a thickness at least equal to $t_2$;
   f) removing an upper portion of the insulating material to expose portions of the sidewalls of the upper silicon pattern;
   g) forming a gate dielectric layer on the exposed portions of the sidewalls of the upper silicon pattern; and
   h) forming a gate electrode on the gate dielectric layer.

8. A method of manufacturing a semiconductor device according to claim 7, wherein:
   a) forming the etch mask pattern on the silicon substrate includes;
      a1) forming an oxide layer on the silicon substrate;
      a2) forming a nitride layer on the oxide layer;
      a3) forming a photoresist pattern on the nitride layer;
      a4) removing the portions of the nitride layer and the oxide layer that are not protected by the photoresist pattern; and
      a5) removing the photoresist pattern.

9. A method of manufacturing a semiconductor device according to claim 7, wherein:
   c) forming spacer structures on the sidewalls of the intermediate silicon pattern includes;
      c1) forming an oxide layer on the intermediate silicon pattern;
      c2) forming a nitride layer on the oxide layer;
      c3) removing a portion of the nitride layer and a portion of the oxide layer to form spacer structures on the sidewalls of the intermediate silicon pattern.

10. A method of manufacturing a semiconductor device according to claim 7, wherein:
    e) depositing an insulating material on the final silicon pattern, the insulating material having a thickness at least equal to $t_2$ includes;
       e1) depositing an insulating material layer to a thickness greater than $t_1+t_2$; and
       e2) removing an upper portion of the insulating material layer to expose an upper surface of the intermediate silicon pattern and an upper surface of the spacer structures.

11. A method of manufacturing a semiconductor device according to claim 10, wherein:
    f) exposing at least a portion of the sidewalls of the upper silicon pattern includes;
       f1) removing at least an upper portion of the nitride included in the spacer structures; and
       f2) removing at least an upper portion of the oxide included in the spacer structures.

12. A method of manufacturing a semiconductor device according to claim 10, wherein:
    the insulating material layer includes a layer of silicon nitride and a layer of silicon oxide.

13. A method of manufacturing a semiconductor device according to claim 10, wherein:
    the insulating material layer includes a layer of silicon nitride and two layers of silicon oxide, the layer of silicon nitride being arranged between the layers of silicon oxide.

14. A method of manufacturing a semiconductor device according to claim 7, further comprising:
    implanting a dopant species into a region of the exposed portion of the intermediate silicon pattern to modify transistor channel characteristics
    after f) exposing at least a portion of the sidewalls of the upper silicon pattern and
    before g) forming a gate dielectric layer on the exposed portions of the sidewalls of the upper silicon pattern.

15. A method of manufacturing a semiconductor device according to claim 14, wherein:
    an implant beam used to implant the dopant species into a region of the exposed portion of the intermediate silicon pattern departs from a perpendicular orientation relative to a plane defined by a major surface of the semiconductor substrate by an offset angle of between about 5 degrees and about 30 degrees.

* * * * *